US 9,951,420 B2

(12) United States Patent
Alcott

(10) Patent No.: US 9,951,420 B2
(45) Date of Patent: Apr. 24, 2018

(54) NANOWIRE GROWTH SYSTEM HAVING NANOPARTICLES AEROSOL GENERATOR

(71) Applicant: SOL VOLTAICS AB, Lund (SE)

(72) Inventor: Greg Alcott, Malmö (SE)

(73) Assignee: SOL VOLTAICS AB, Lund (SE)

( * ) Notice: Subject to any disclaimer, the term of this patent is extended or adjusted under 35 U.S.C. 154(b) by 0 days.

(21) Appl. No.: 14/537,247

(22) Filed: Nov. 10, 2014

(65) Prior Publication Data
US 2016/0130698 A1    May 12, 2016

(51) Int. Cl.
C23C 16/00 (2006.01)
C23C 16/455 (2006.01)
C23C 16/46 (2006.01)
C23C 16/52 (2006.01)
C23C 16/448 (2006.01)
C23C 14/22 (2006.01)
C30B 25/16 (2006.01)
C30B 29/60 (2006.01)

(52) U.S. Cl.
CPC .......... C23C 16/455 (2013.01); C23C 14/228 (2013.01); C23C 16/4481 (2013.01); C23C 16/46 (2013.01); C23C 16/463 (2013.01); C23C 16/52 (2013.01); C30B 25/165 (2013.01); C30B 29/60 (2013.01)

(58) Field of Classification Search
CPC ................................................... C23C 14/246
USPC .................................................. 118/726, 727
See application file for complete search history.

(56) References Cited

U.S. PATENT DOCUMENTS 3,562,009 A * 2/1971 Cranston ............... C23C 14/046
                                                              174/266
4,022,928 A * 5/1977 Piwcyzk ............... C23C 14/042
                                                              204/192.12
4,548,798 A * 10/1985 Rice ....................... B01J 19/121
                                                              423/263

(Continued)

FOREIGN PATENT DOCUMENTS

GB         2436398 A      9/2007
KR     1020080067109 A    7/2008

(Continued)

OTHER PUBLICATIONS

S. H. Kim Understanding ion-mobility and transport properties of aerosol nanowires, ScienceDirect, Aerosol Science 38 (2007), 823-842.*

(Continued)

Primary Examiner — Keath T Chen
(74) Attorney, Agent, or Firm — The Marbury Law Group PLLC

(57) ABSTRACT

A nanoparticles aerosol generator is disclosed. The nanoparticles aerosol generator includes an evaporation chamber having a wall, a container containing a source material, and a heating device configured to heat the source material. The nanoparticles aerosol generator also includes a carrier gas source configured to blow a carrier gas toward the source material to generate a nanoparticles aerosol with nanoparticles of the source material suspended therein. The nanoparticles aerosol generator further includes a dilution gas source configured to supply a dilution gas into the chamber to flow substantially along the wall within the chamber and to dilute the nanoparticles aerosol.

20 Claims, 16 Drawing Sheets

(56) References Cited

U.S. PATENT DOCUMENTS

| | | | |
|---|---|---|---|
| 5,395,180 A * | 3/1995 | Mariner | C23C 14/26 118/726 |
| 5,665,277 A | 9/1997 | Johnson et al. | |
| 5,776,254 A * | 7/1998 | Yuuki | C23C 16/409 118/715 |
| 5,958,348 A * | 9/1999 | Bi | B01J 12/005 266/168 |
| 6,054,041 A | 4/2000 | Ellis et al. | |
| 6,106,890 A * | 8/2000 | Hayashi | C23C 14/046 427/181 |
| 6,521,047 B1 * | 2/2003 | Brutti | B01D 1/0017 118/726 |
| 7,115,230 B2 | 10/2006 | Sundararajan et al. | |
| 7,332,040 B1 * | 2/2008 | Kojima | C23C 16/4481 118/715 |
| 7,967,891 B2 | 6/2011 | Paserin et al. | |
| 8,246,933 B2 | 8/2012 | Jiang et al. | |
| 8,268,281 B2 | 9/2012 | Harutyunyan et al. | |
| 8,940,562 B1 * | 1/2015 | Li | H01L 51/0004 257/E21.499 |
| 2003/0192471 A1 | 10/2003 | Jurgensen et al. | |
| 2004/0075464 A1 | 4/2004 | Samuelson et al. | |
| 2005/0054004 A1 | 3/2005 | Alivisatos et al. | |
| 2005/0170089 A1 | 8/2005 | Lashmore et al. | |
| 2006/0112882 A1 * | 6/2006 | Suzuki | C23C 16/4481 118/726 |
| 2006/0233968 A1 * | 10/2006 | Ohkawa | C23C 14/28 427/561 |
| 2007/0034155 A1 | 2/2007 | Takatsu | |
| 2007/0107654 A1 * | 5/2007 | Motakef | C23C 16/303 117/88 |
| 2007/0148962 A1 | 6/2007 | Kauppinen et al. | |
| 2007/0218200 A1 * | 9/2007 | Suzuki | C23C 16/16 427/248.1 |
| 2008/0000497 A1 * | 1/2008 | Verhaverbeke | G03F 7/427 134/1.1 |
| 2008/0213138 A1 * | 9/2008 | Nakayama | B01J 8/008 422/146 |
| 2009/0114848 A1 * | 5/2009 | Iwata | C23C 14/28 250/492.1 |
| 2009/0243043 A1 * | 10/2009 | Wang | C30B 23/007 257/615 |
| 2009/0317336 A1 | 12/2009 | Gupta et al. | |
| 2009/0317504 A1 * | 12/2009 | Rajala | B01J 2/04 425/7 |
| 2010/0272905 A1 | 10/2010 | Byeon et al. | |
| 2011/0309306 A1 | 12/2011 | Zhou et al. | |
| 2013/0098288 A1 | 4/2013 | Samuelson et al. | |
| 2013/0109170 A1 * | 5/2013 | Awano | B82Y 10/00 438/622 |
| 2015/0152570 A1 | 6/2015 | Alcott et al. | |

FOREIGN PATENT DOCUMENTS

| | | |
|---|---|---|
| TW | 201100175 A | 1/2011 |
| WO | 2004004927 A2 | 1/2004 |
| WO | 2004038767 A2 | 5/2004 |
| WO | 2007010781 A1 | 1/2007 |
| WO | WO2011078780 A1 | 6/2011 |
| WO | 2011142717 A1 | 11/2011 |
| WO | WO2013154490 A3 | 10/2013 |
| WO | 2013176619 A1 | 11/2013 |
| WO | WO2013176619 A1 | 11/2013 |

OTHER PUBLICATIONS

European Patent Office, International Search Report for PCT/SE2013/050594, dated Sep. 5, 2013.
European Office Communication for EP Application No. 13 726 897.5, dated Apr. 19, 2016, 4 pages.
Kim, S. H. et al., "Understanding Ion-Mobility and Transport Properties of Aerosol Nanowires," Journal of Aerosol Science, vol. 38, pp. 823-842, (2007).
International Preliminary Report on Patentability, International Application No. PCT/SE2013/050594, dated Nov. 25, 2014.
Hara et al., "High-Rate Particle Growth Using GaCl and NH3 as Sources in Two-Stage Vapor-Phase Method for Synthesis of GaN Powders," Japanese Journal of Applied Physics, Japan Society of Applied Physics, Tokyo, Japan, vol. 42, No. 12A, Part 02, Dec. 2002.
Deppert et al., "InP Nanocrystals via Aerosol Route," 1997 Int. Conference on Indium Phosphide and Related Materials, Hyannis, MA, May 11-15, 1997, IEEE, pp. 79-82.
Pham et al., "InN p-i-n. Nanowire Solar Cells on Si," IEEE Journal of Selected Topics in Quantum Electronics, vol. 17, No. 4, Jul. 2011, pp. 1062-1069.
Mangusson et al., "Gold Nanoparticles: Production, Reshaping, and Thermal Charging," Journal of Nanoparticle Research, vol. 1, No. 2, pp. 243-251.
International Search Report & Written Opinion issued in PCT Application No. PCT/IB2015/002407, dated Apr. 21, 2016.
Deppert K et al: "InP nanocrystals via aerosol route", 1997 Int. Conference on Indium Phosphide and Related Materials. Hyannis, Cape Cod, May 11-15, 1997: [Indium Phosphide and Related Materials], New York, NY: IEEE, US, May 11, 1997, (May 11, 1997), pp. 79-82, XP010232093.
International Search Report and Written Opinion of the International Search Authority for International Application No. PCT/IB2015/002407, dated Apr. 21, 2016, 13 pages.
International Preliminary Report on Patentability from the International Bureau for International Patent Application No. PCT/IB2015/002407, dated May 26, 2017, 8 pages.
Trassoudaine, A. et al., "Growth of Gallium Nitride by Hydride Vapor Phase Epitaxy," Nitride Semiconductors Handbook on Materials and Devices, Ruterana, P., Albrecht, M., and Neugebauer, J. (Eds.), Wiley-Vch Verlag GmbH & Co., 6 pages, (2003).
Hemmingsson, C. et al., "Growth of Bulk GaN in a Vertical Hydride Vapour Phase Epitaxy Reactor," Science Direct, Superlattices and Microstructures, vol. 40, pp. 205-213, (2006).
Streetman, B. G., "Growth of Semiconductor Crystals," Solid State Electronic Devices, Second Edition, Prentice-Hall Series in Solid State Physical Electronics, 4 pages, (1980).

* cited by examiner

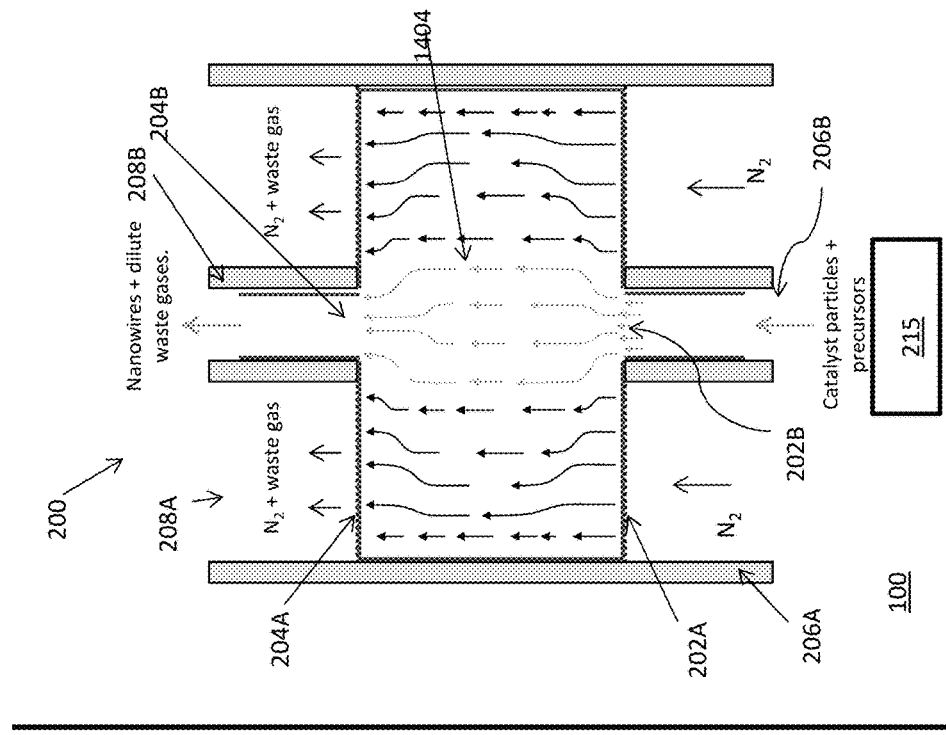
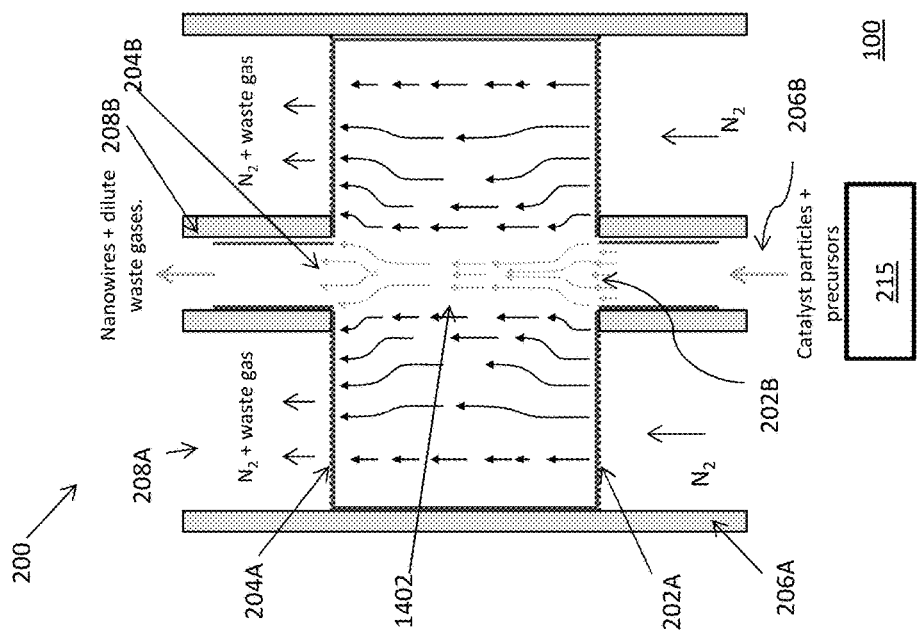

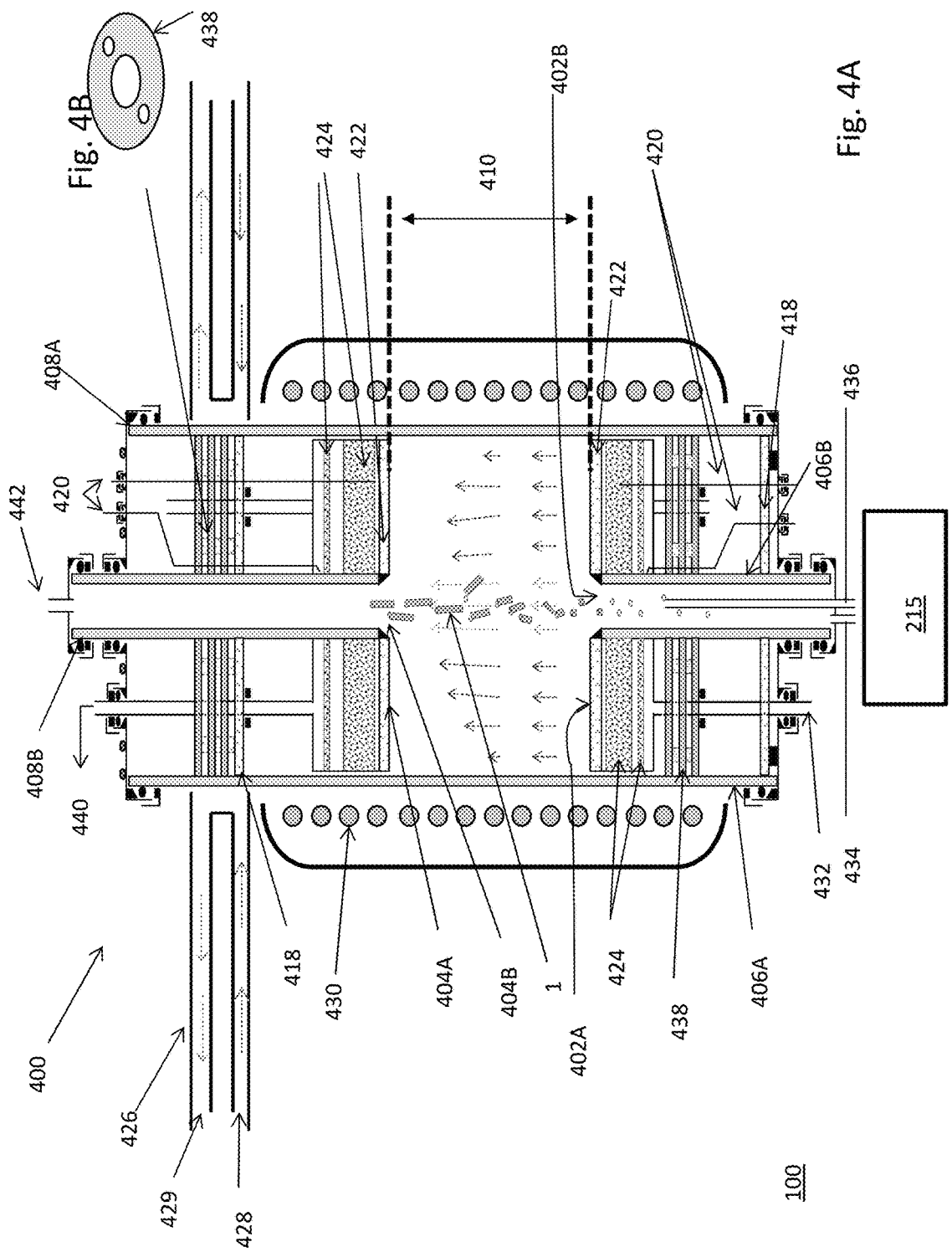

```
START → HEAT A SOURCE MATERIAL → BLOW A CARRIER GAS TOWARD THE SOURCE MATERIAL TO GENERATE A NANOPARTICLES AEROSOL → SUPPLY A DILUTION GAS INTO A CHAMBER TO DILUTE THE NANOPARTICLES AEROSOL → END
```

3010 — HEAT A SOURCE MATERIAL
3020 — BLOW A CARRIER GAS TOWARD THE SOURCE MATERIAL TO GENERATE A NANOPARTICLES AEROSOL
3030 — SUPPLY A DILUTION GAS INTO A CHAMBER TO DILUTE THE NANOPARTICLES AEROSOL

NANOWIRE GROWTH SYSTEM HAVING NANOPARTICLES AEROSOL GENERATOR

FIELD

The present invention relates to a nanowire growth system and in particular to a nanowire growth system having a nanoparticles aerosol generator.

BACKGROUND

Small elongated objects, usually referred to as nanowires, nanorods, nanowhiskers, etc. and typically including semiconductor materials, have up till now been synthesized using one of the following routes:
- liquid phase synthesis, for example by means of colloidal chemistry as exemplified in U.S. Patent Application Publication No. 2005/0054004 by Alivisatos et al.,
- epitaxial growth from substrates, with or without catalytic particles as exemplified by the work of Samuelson et al. presented in WO 2004/004927 and WO 2007/10781, respectively, or
- gas phase synthesis by means of a laser assisted catalytic growth process as exemplified in WO 2004/038767 A2 by Lieber et al.

The properties of wires obtained using these routes are compared in the following table.

|  | Material quality | Width/length and size control | Structural complexity | Scalability/cost of production |
| --- | --- | --- | --- | --- |
| Liquid phase | High | Thin/short Medium control | LOW | High/High |
| Substrate-based | High | All/All High control | HIGH | Low/High |
| Laser assisted | Medium | Thin/long Medium control | LOW | Medium/Medium |

Consequently, the choice of synthesis route is a compromise between different wire properties and the cost of production. For example, substrate-based synthesis provides advantageous wire properties. However, since wires are formed in batches, the scalability of the process, and thus the production cost and through-put, are limited.

SUMMARY

An embodiment relates to a nanoparticles aerosol generator. The nanoparticles aerosol generator includes an evaporation chamber having a wall, a container containing a source material, and a heating device configured to heat the source material. The nanoparticles aerosol generator also includes a carrier gas source configured to blow a carrier gas toward the source material to generate a nanoparticles aerosol with nanoparticles of the source material suspended therein. The nanoparticles aerosol generator further includes a dilution gas source configured to supply a dilution gas into the chamber to flow substantially along the wall within the chamber and to dilute the nanoparticles aerosol.

Another embodiment relates to a nanowire growth system. The nanowire growth system includes a reaction chamber including a first wall, a first inlet configured to deliver a first flow into the reaction chamber, and a second inlet configured to deliver a second flow into the reaction chamber. The first inlet is located concentrically with the second input and the first and second inputs are configured such that the second flow delivered from the second input provides a sheath between the first flow delivered from the first input and the first wall of the reaction chamber. The nanowire growth system further includes a nanoparticles aerosol generator. The nanoparticles aerosol generator includes an evaporation chamber having a second wall, the evaporation chamber disposed upstream of least one of the first inlet and the second inlet, a container containing a source material, and a heating device configured to heat the source material. The nanoparticles aerosol generator includes a carrier gas source configured to blow a carrier gas toward the source material to generate a nanoparticles aerosol with nanoparticles of the source material suspended therein, and a dilution gas source configured to supply a dilution gas into the evaporation chamber to flow substantially along the second wall within the evaporation chamber and to dilute the nanoparticles aerosol.

Another embodiment relates to a method of fabricating nanowires. The method includes generating a nanoparticles aerosol using a carrier gas that is blown toward a source material disposed within an evaporation chamber, the nanoparticles aerosol including nanoparticles of the source material. The method includes diluting the nanoparticles aerosol using a dilution gas, the dilution gas flowing substantially along an inner surface of a first wall of the evaporation chamber. The method includes providing a first gas stream to a first reaction chamber, wherein the first gas stream includes the nanoparticles and a first precursor for fabricating the nanowires. The method includes providing a second gas stream to the first reaction chamber, wherein the second gas stream forms a sheath separating the first gas stream from a second wall of the first reaction chamber. The method includes growing the nanowires in a gas phase in the first reaction chamber.

Another embodiment relates to a nanowire growth system. The nanowire growth system includes means for generating a nanoparticles aerosol using a carrier gas that is blown toward a source material disposed within an evaporation chamber, the nanoparticles aerosol including nanoparticles of the source material. The nanowire growth system includes means for diluting the nanoparticles aerosol using a dilution gas, the dilution gas flowing substantially along an inner surface of a first wall of the evaporation chamber. The nanowire growth system includes means for providing a first gas stream to the reaction chamber, wherein the first gas stream includes the nanoparticles and a first precursor for fabricating the nanowires. The nanowire growth system includes means for providing a second gas stream to the reaction chamber, wherein the second gas stream forms a sheath separating the first gas stream from a second wall of the reaction chamber. The nanowire growth system includes means for growing the nanowires in a gas phase in the reaction chamber.

Another embodiment relates to a method of generating a nanoparticles aerosol. The method includes heating a source material, blowing a carrier gas toward the source material to generate the nanoparticles aerosol that flows within a chamber having a wall, and supplying a dilution gas into the chamber to dilute the nanoparticles aerosol, the dilution gas flowing substantially along an inner surface of the wall.

BRIEF DESCRIPTION OF THE DRAWINGS

FIG. 3A is a schematic illustration of the nanowire growth system of FIG. 1 operated in an embodiment with low core flow.

FIG. 3B is a schematic illustration of the nanowire growth system of FIG. 1 operated in an embodiment with high core flow.

FIG. 4A is a schematic illustration of an exemplary nanowire growth system.

FIG. 4B is a top view of an exemplary heat transfer component of the nanowire growth system of FIG. 4A.

FIG. 16 is a flowchart showing an exemplary method of generating a nanoparticles aerosol.

DETAILED DESCRIPTION

To grow nanowires with controlled dimensions (e.g., sizes, such as lengths), conventional systems nucleate and grow the nanowires on a single crystal substrate. Nanowires are nanoscale structures that have a diameter or width less than 1 micron, such as 2-500 nm or 10-200 nm. The length may also be greater than 1 micron. The present inventors have developed systems and methods for growing nanowires having controlled dimensions in a gas/aerosol phase which does not require the use of a single crystal substrate. Systems and methods for growing nanowires in a gas/aerosol phase are described in PCT Application Publications WO 11/142, 717, and WO 2013/176619, the contents of these applications are expressly incorporated herein by reference in their entireties. Aerosol nanoparticles used to seed growth of nanowires can be generated in a furnace and flown into a reactor for growing the nanowires.

Size selection of the nanoparticles may be conducted in a differential mobility analyzer (DMA) disposed downstream of a furnace (e.g., an aerosol generator). It is, however, difficult to produce size-selected particles at high concentration (e.g., high density). Typically, a large fraction (typically 95%) of the primary aerosol nanoparticles is lost in the size selection process in the DMA when conventional systems are used. Due to the large loss of primary nanoparticles in the DMA, it becomes difficult to produce high particle densities after size selection. For example, conventional systems may generate nanoparticles of a typical size of 20 nm-100 nm, at a concentration of much less than $10^6$ particles/cm$^3$. In some applications, however, it may be desirable to generate nanoparticles having a larger size, a narrower size distribution, and a higher density. For example, it may be desirable to generate nanoparticles having a size of greater than 100 nm (e.g., 100 nm-200 nm), with a narrow size distribution (e.g., standard deviation<10% of the mean, such as ≤5% of the mean, or between 3%-5% of the mean), and a high density (e.g., >$10^6$ particles/cm$^3$). Conventional systems and methods for producing narrow size distribution aerosols using a differential mobility analyzer often result in poor utilization of primary aerosol nanoparticles and low aerosol nanoparticles densities (e.g., lower than $10^7$ particles/cm$^3$ or $10^8$ particles/cm$^3$). Thus, it is desirable to develop systems and methods for controlling the primary particle size and/or density prior to and/or after the DMA size selection so as to enhance the particle size and/or density of the aerosol flow.

Figure 1:
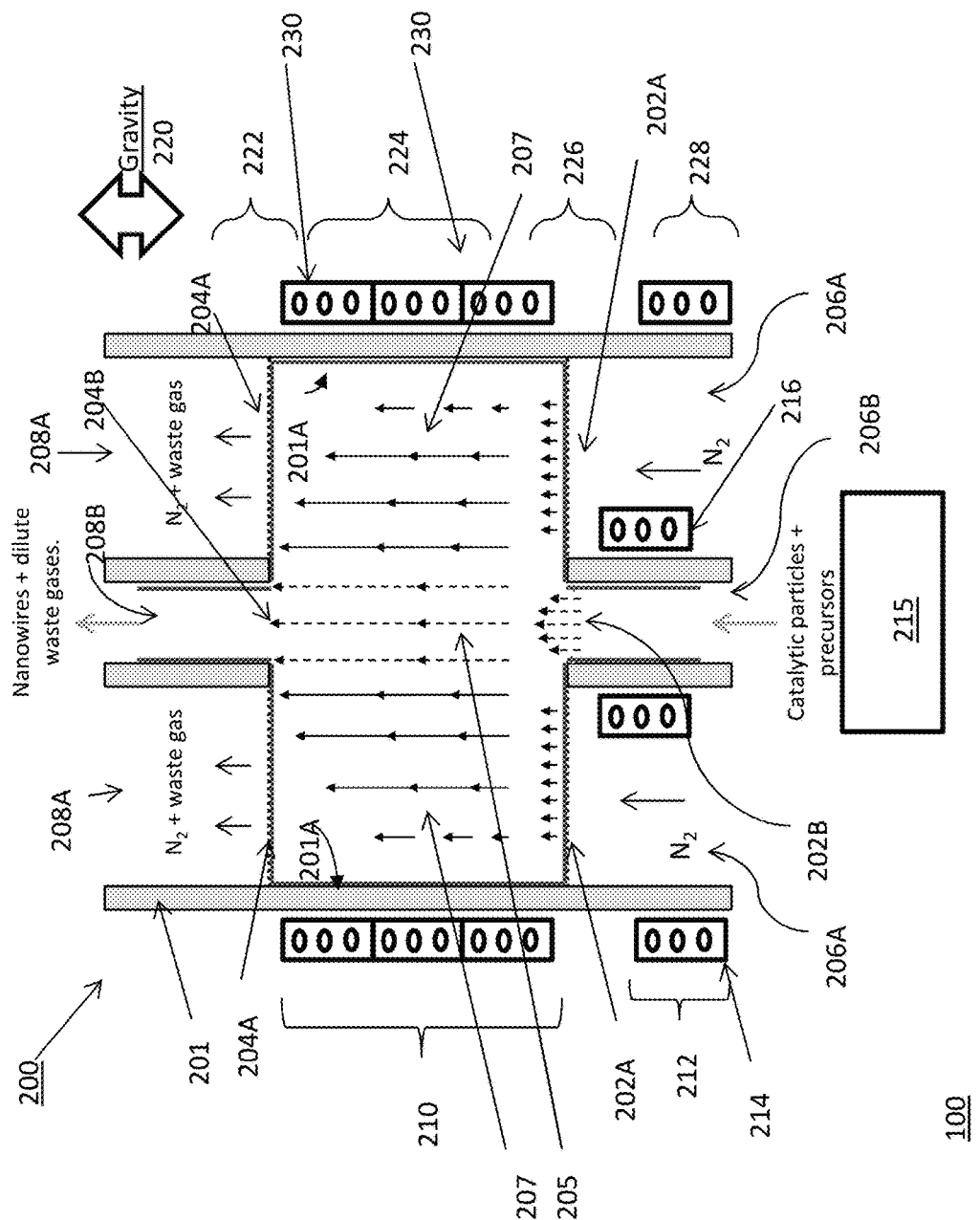
FIG. 1 is a schematic illustration of an exemplary nanowire growth system.

FIG. 1 schematically illustrates an exemplary nanowire growth system 100, which may include a reactor 200. One example of the nanowire growth reactor 200 may be an Aerotaxy™ nanowire growth reactor. Aerotaxy™ is a trademark of Qunano AB and refers to a gas phase nanowire growth apparatus/process. In the reactor 200, concentric flows may be generated and used to reduce variations in the velocity of the flow caused by the viscous effect of the walls of the reactor (e.g., the central part of the flow may have a greater velocity than the part closer to the wall). The concentric flow may also reduce variations in temperature and gas concentration conditions in the core part (central part) of the flow. By confining catalytic nanoparticles to the core region (inside a sheath flow) every particle may have a substantially similar process condition.

The reactor 200 may include a housing 201 (e.g., a CVD reaction tube), which may be oriented vertically, horizontally, or at a suitable angle with respect to the horizon or the vertical directions. The reactor 200 may include an outer inlet 202A and an outer outlet 204A. The reactor 200 may include an inner inlet 202B and an inner outlet 204B. The reactor 200 may include a reaction chamber 210 (or reaction zone 210). In some embodiments, the reaction chamber 210 may be divided into more than one reaction zones. The inner inlet 202B may be located concentrically with the outer inlet 202A, with the outer inlet 202A surrounding the inner inlet 202B. The inner inlet 202B may be located at a center portion of one end of the reaction zone 210, and the inner outlet 204B may be located at a center portion of the other end of the reaction chamber 210. In some embodiments, the inner inlet 202B may be located off the center by, e.g., 1%-25%, such as by 1%-10%. The inner outlet 204B may correspondingly be located off the center, e.g., 1%-25%, such as by 1%-10%.

The outer inlet 202A and the inner inlet 202B may be inlet openings to the reaction chamber 210 of the reactor 200, and may be connected to any suitable gas or aerosol delivery conduits, such as one or more cylinders, hoses, pipes, or manifolds. For example, the outer inlet 202A may be connected to an outer inlet conduit 206A, which may supply one or more inert gases to the outer inlet 202A. The inner inlet 202B may be connected to an inner inlet conduit 206B, which may supply a precursor gas to the inner inlet 202B.

Catalytic particles (e.g., catalytic nanoparticles generated by a nanoparticles aerosol generator discussed below) may be supplied to the reaction chamber 210 through the inner inlet 202B, together with the precursor gas. The inner outlet 204B and the outer outlet 204A may be connected to an inner outlet conduit 208B and an outer outlet conduit 208A, respectively.

In some embodiments, the inner inlet 202B may be configured to deliver a first flow 205 (e.g., a first fluid flow, such as a first gas stream) into the reaction chamber 210. The first fluid flow may include a first fluid, which may include at least one precursor gas and the catalytic nanoparticles aerosol. The first flow 205 may be located at the center portion of the reaction chamber 210, as shown by the dotted arrows in FIG. 1.

The outer inlet 202A may be configured to deliver a second flow 207 (e.g., a second fluid flow, such as a second gas stream) surrounding the first flow 205. The second flow 207 may provide a sheath between the first flow 205 and the wall 201A of the housing 201, as indicated by the solid arrows in FIG. 1. The configuration of the second flow 207 surrounding the first flow 205 may be accomplished, for example, by providing both the first and second fluids (e.g., gases) under laminar conditions. The configuration of the second flow 207 surrounding the first flow 205 may also be achieved by configuring the outer inlet 202A to be sufficiently wider (e.g. 50-500% wider) than the inner inlet 202B. The first flow 205 and the second flow 207 may be configured such that even if there may be mixing of the first and second flows 205 and 207 (shown by the arrows in FIG. 1) at the interface between them as they flow through the reaction chamber 210, the thickness of the sheath (second flow 207) may be such that the first flow 205 does not substantially contact the wall 201A of the housing 201 while in the reaction chamber 210. For example, there may be only 0%-5% volume of the first flow 205 that may contact the wall 201A. Under laminar or plug flows, the core flow lines (e.g., the first flow 205) may not contact the reactor wall 201A.

As shown in FIG. 1, in the reactor 200, the core flow (e.g., first flow 205) and sheath flow (e.g., second flow 207) may be matched to initially give a "plug" flow condition, where the flow velocity may be substantially the same over the entire width of the reactor (e.g., a cross section perpendicular to the flow direction). As the flows proceed through the reaction zone 210, surface drag may slow the outermost part of the second flow 207 (which may be a gas stream). Depending on the length of the reactor 200, the flows may or may not have time to fully develop into laminar flows with a parabolic velocity distribution. The plug flow condition may partially be maintained by designing an extractor portion of the reactor (e.g. the outer outlet 204A described below) to pull the sheath (e.g., a gas stream) out of the reaction chamber 210 uniformly. Even in the case of fully laminar flows, the core flow 205 may have a narrow velocity distribution, and thus a narrow range of transit times for the catalytic nanoparticles.

Furthermore, the sheath flow (e.g., second flow 207) may reduce both the deposition of material on the wall 201A of the reactor 200 and eliminate the back-diffusion of material from the wall 201A to the core flow (e.g., first flow 205), ensuring that there is minimal cross-talk between the reaction volume (e.g., first flow 205) and the reactor wall 201A. The process stability may be improved in time, leading to better product and longer maintenance intervals.

Other factors that may be considered when configuring the inner and outer inlets 202A and 202B, and the reactor 200 may be described as boundary conditions. A first boundary condition 220 may relates to the orientation of the reactor 200 with respect to gravity. In some embodiments, the reactor 200 may be oriented such that the direction of flows in the reactor 200 is substantially parallel to the direction of the force of gravity (e.g. within 0-10% deviation from the direction of the force of gravity). In this manner, gravity may not act to cause a mixing flow transverse to the first and second flows 205 and 207 (e.g., flows of gases) through the reactor 200. In some embodiments, the first and second flows 205 and 207 may be configured to flow in the direction of gravity. For example, the outer inlets 202A and inner inlet 202B may be located at the top of the reaction chamber 210 such that gas streams flow "down" through the reaction chamber 210 to the outer outlet 204A and the inner outlet 204B located at the bottom of the reaction chamber 210. In some embodiments, the first and second flows 205 and 207 may flow in the opposite direction of the gravity. For example, the outer inlet 202A and the inner inlet 202B may be located at the bottom of the reaction chamber 210, as shown in FIG. 1, such that the gas streams flow "up" through the reaction chamber 210 to the outer outlet 204A and the inner outlet 204B located at the top of the reaction chamber 210.

A second boundary condition 222 may relate to uniform extraction of the sheath (e.g., the second flow 207, which may be a gas stream) from the reactor 200. Non-ideality at the output end of the reactor 200 may be minimized or eliminated by configuring the outer outlet 204A such that the sheath (e.g., second flow 207) is uniformly extracted from the reaction chamber 210. To extract the second flow 207 at the outer outlet 204A, a fan or a vacuum device (not shown) may be included in the reactor 200, for example, adjacent the outer outlet 204A. A corresponding fourth boundary condition 226 may relate to uniform injection of the sheath (e.g., second flow 207) to the reaction chamber 210. Non-ideality at the input end of the reaction chamber 210 and through the reaction chamber 210 may be minimized or eliminated with uniform injection of the second flow 207 (which may include one or more gases) through the outer inlet 202A. The resulting uniform flow (e.g., second flow 207) though the reactor 200 may be described as 'plug' flow.

A third boundary condition 224 may relate to uniform flow (e.g., first and second flows 205 and 207, which may include at least one gas) and wall temperature in the reaction chamber 210. By making the wall temperature and the flow temperature uniform, such as within a variance of less than 5%, e.g. 0-5%, in the reaction chamber 210, the formation of convection currents may be reduced or eliminated. This in turn may reduce the likelihood of generating non-uniform flow conditions in the reactor 200.

A fifth boundary condition 228 may relate to maintaining a controlled temperature gradient in a first heating zone 212 in the outer inlet conduit 206A which may be connected to the outer inlet 204A. The temperature of the sheath (e.g., second flow 207, which may include at least one gas) may be raised to a desired reaction temperature in the first heating zone 212 using one or more heaters 214 located adjacent to the outer inlet conduits 206A (e.g., surrounding an outside wall of the housing 201). As discussed in more detail below, a first precursor gas and/or catalytic nanoparticles may be heated to the desired reaction temperature with one or more heaters 216 located adjacent the inner inlet 202B (e.g., surrounding an outer wall of the inner inlet 202B). Alternatively, the first precursor gas may be actively cooled until the point of entry into the reaction chamber 210, in which case the one or more second heaters 216 may be replaced with one or more cooling devices. In some embodiments, the devices 216 may provide both heating and cooling effects. Thus, devices 216 may be referred to as one or more temperature control devices 216 (i.e., a heater and/or cooler). In some embodiments, the reaction chamber 210 may be heated with one or more heaters 230 that may be located along the reaction chamber 210 (e.g., surrounding the outer wall of the housing 201). These heaters 230 may be controlled independently and thereby more than one reaction chamber 210 may be established within the reactor 200.

One or more inert gases may be supplied to the outer inlet 202A via the outer input conduit 206A. One or more semiconductor nanowire precursor gases may be provided to the inner inlet 202B via the inner input conduit 206B. The rector 200 does not include a growth or deposition substrate in the reaction chamber 210; instead the nanowires are collected from the inner output conduit 208B via the inner outlet 204B and then deposited on a substrate. Additionally, the nanowires grown by the systems and methods of the present disclosure do not need laser assistance for growth.

The second flow 207 (e.g., sheath gas) exiting the reaction chamber 210 may be collected through the outer outlet 204A while the nanowires and unreacted precursor gas may be collected through the inner outlet 204B. If an inert gas is used as the sheath gas, some unreacted precursor gas may mix with the inert gas in the reaction chamber 210 and exit via the outer outlet 204A. This unreacted precursor gas may be separated from the inert sheath gas and recycled for later use in the reactor 200.

Catalytic nanoparticles may be provided to one or more of the first and second flows 205 and 207. Catalytic materials include, but are not limited to, Au, Ag, Cu, Fe, Ni, Ga, In, Al and alloys thereof. The catalytic nanoparticles may consist of a single element, or a combination (e.g. alloy) of two or more elements. Further, the catalytic nanoparticles may be provided with or without an electrical charge. The catalytic nanoparticles may be provided in the form of an aerosol generated by an upstream nanoparticles aerosol generator or evaporator 215 discussed in more detail below. Alternatively, the catalytic nanoparticles may be formed in-situ by providing a gaseous precursor (e.g. trimethyl gallium (TMG)) that reacts or decomposes to form catalytic nanoparticles (e.g., Ga). While the inert gas forms an outer sheath or cylinder along the reactor wall 201A, a catalytic nanoparticles aerosol forms or is provided to a middle sheath or cylinder inside the outer sheath. Nanowire precursor(s) form an inner gas stream inside the middle sheath which interacts with the catalytic nanoparticles in the middle sheath to grow nanowires therein. Additionally, one or more of the precursor gases may also be provided to the outer inlet conduit 206A, thus being allowed to diffuse into the flow of catalytic nanoparticles.

Figure 2:
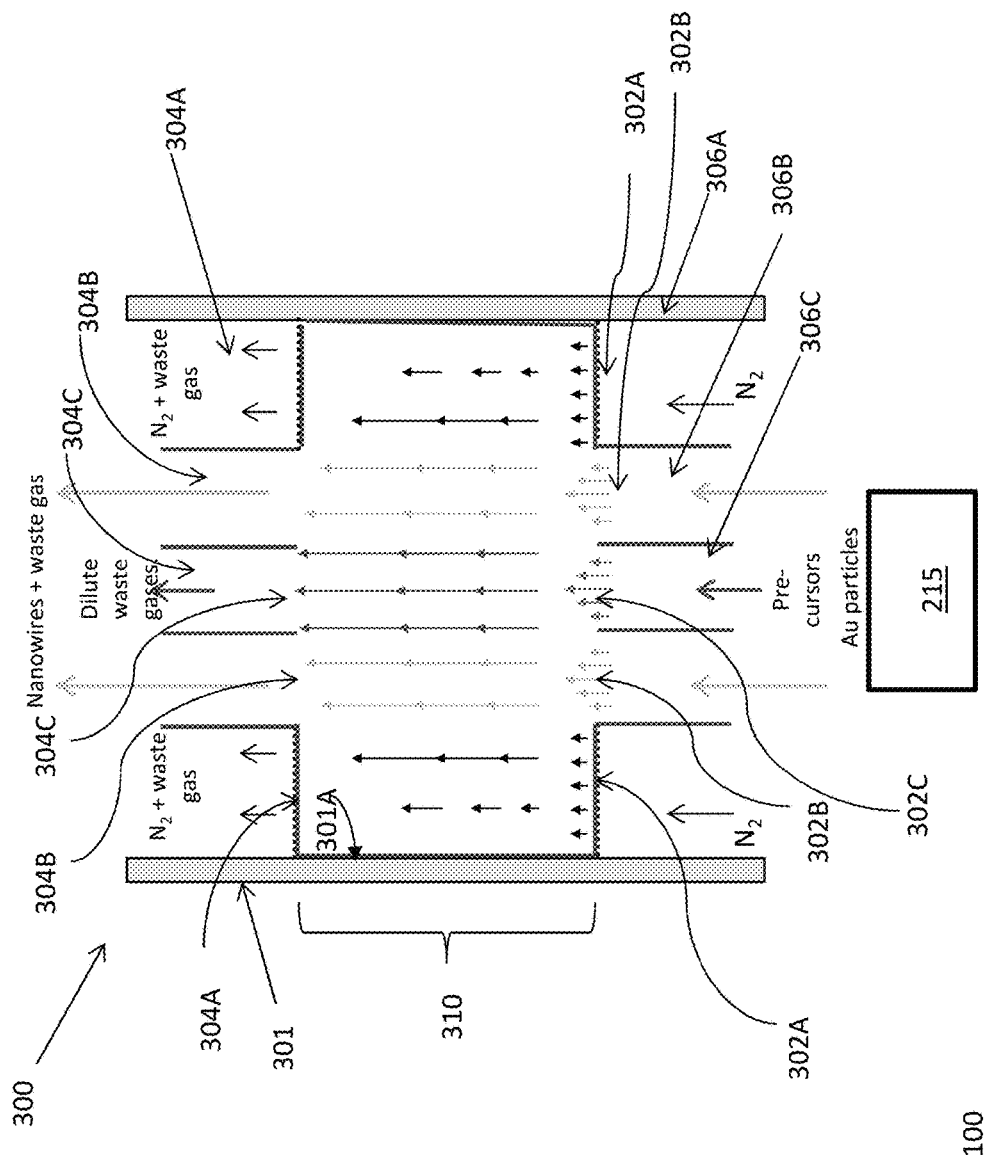
FIG. 2 is a schematic illustration of another exemplary nanowire growth system.

FIG. 2 illustrates an exemplary nanowire growth system 100 having an exemplary nanowire growth reactor 300, which may be an Aerotaxy™ nanowire growth reactor. The reactor 300 may include a housing 301 having inner wall 301A. The reactor 300 may include a reaction chamber 310. For illustrative purposes, FIG. 2 may not show all elements of the reactor 300. The reactor 300, however, may include elements similar to those included in the reactor 200, such as, for example, the heater/coolers. The reactor 300 may include three inlets 302A, 302B, and 302C and three outlets 304A, 304B, and 304C. The three inlets 302A, 302B, and 302C and three outlets 304A, 304B, and 304C may be respective inlet and outlet openings to any suitable delivery or extraction conduit, such as a cylinder, hose, pipe or manifold. The sheath gas may be provided to the outermost inlet 302A.

In some embodiments, catalytic nanoparticles, such gold or silver, may be provided to the middle inlet 302B. As discussed above the catalytic nanoparticles may include individual metals or alloys. The catalytic nanoparticles may be provided in the form of an aerosol generated by the upstream nanoparticles aerosol generator 215 discussed in more detail below.

One or more nanowire precursor gases may be provided to the inner inlet 302C. As discussed in more detail below, one or more doping gases may also be provided to the inner inlet 302C to dope the growing nanowire. In some embodiments, the precursor and doping gases may be provided to the middle inlet 302B while the catalytic nanoparticles may be provided to the inner inlet 302C. In some embodiments, the precursor and doping gases may be provided to the inner inlet 302C with the catalytic nanoparticles generated by the nanoparticles aerosol generator 215. In some embodiments, a first precursor gas may be provided either to the middle inlet 302B, the inner inlet 302C, or both, while a second, different precursor gas may be provided to any of the middle inlet 302B and the inner inlet 302C, or both. In some embodiments, catalytic nanoparticles may be provided to either or both of the middle inlet 302B and the inner inlet 302C. One or more of the precursor gases may also be provided to the outer inlet 302A, thus being allowed to diffuse into the flow of catalytic nanoparticles.

The inlets 302A, 302B, and 302C may be configured such that the flow (which may include at least one gas) delivered from the outer inlet 302A may provide a sheath between the precursor gases and/or the catalytic nanoparticles aerosol, and the wall 301A of the housing 301 at the reaction chamber 310. In this manner, the growing nanowires in the central or middle gas steam from inlets 302A and 302B may experience substantially the same process conditions for substantially the same amount of time, thereby enabling the nanowires to grow with a narrow range of controlled dimensions (e.g., sizes, such as diameters or lengths). Sheath gas exiting the reaction chamber 310 may be collected at the outer outlet 304A. The unused precursor gas(es) and the nanowires may be collected in with the middle and inner outlets 304B and 304C. For example, nanowire and waste gas may be collected in the middle outlet 304B, waste gas in the inner outlet 304C, and waste gas in the outer outlet 304A. Unused precursor gas entrained in the sheath gas may be separated from the sheath gas and reused.

FIGS. 3A and 3B illustrate exemplary methods of operating the nanowire growth reactor 200 (e.g., an Aerotaxy™ nanowire growth reactor) of FIG. 1. Similar methods may also be applied to operate the nanowire growth reactor 300 of FIG. 2. Specifically, FIG. 3A illustrates the fluid behavior in the reactor 200 when operating with a low core flow (e.g., the core flow rate is less than the sheath flow rate), while FIG. 3B illustrates the fluid behavior in the reactor 200 when operating with a high core flow (e.g., the core flow rate is greater than the sheath flow rate). The residence time of the nanowires in the reactor 200 (e.g., the time during which the nanowires travel within the reaction chamber 210) may be influenced by controlling the ratios of flows (e.g., flow rates) in the core region (e.g., flow from inner inlet 202B) and sheath region (e.g., flow from outer inlet 202A). If the sheath gas flow (e.g., flow from outer inlet 202A) is increased such that the mean gas velocity in the sheath is higher than the core flow (e.g., flow from the inner inlet 202B), then the gas in the core flow may accelerate, resulting in a contraction 1402 in the diameter (or width) of the core flow stream, as depicted in FIG. 3A. If the inverse flow situation is applied, whereby the mean velocity of the core gas is higher than that of the sheath gas, then the core gas flow (and the catalytic nanoparticles contained within) may expand, increasing the diameter (or width) of core gas stream, as depicted in FIG. 3B.

The configuration in FIG. 3A may result in a decrease in nanowire residence time in the reactor 200, while the configuration illustrated in FIG. 3B may result in an increase in nanowire residence time in the reactor 200. This process may be important when reactors 200 are placed in series as the flow into the second stage reactor will be directly dependent on the flow coming from the first stage. This method allows the residence time in sequential reactors 200 to be independently controlled. The methods of operation described above in connection with FIGS. 3A and 3B may also be applicable to other reactors, such as the reactor 300 of FIG. 2 and a reactor 400 of FIG. 4A, which is described below.

Figure 3C:
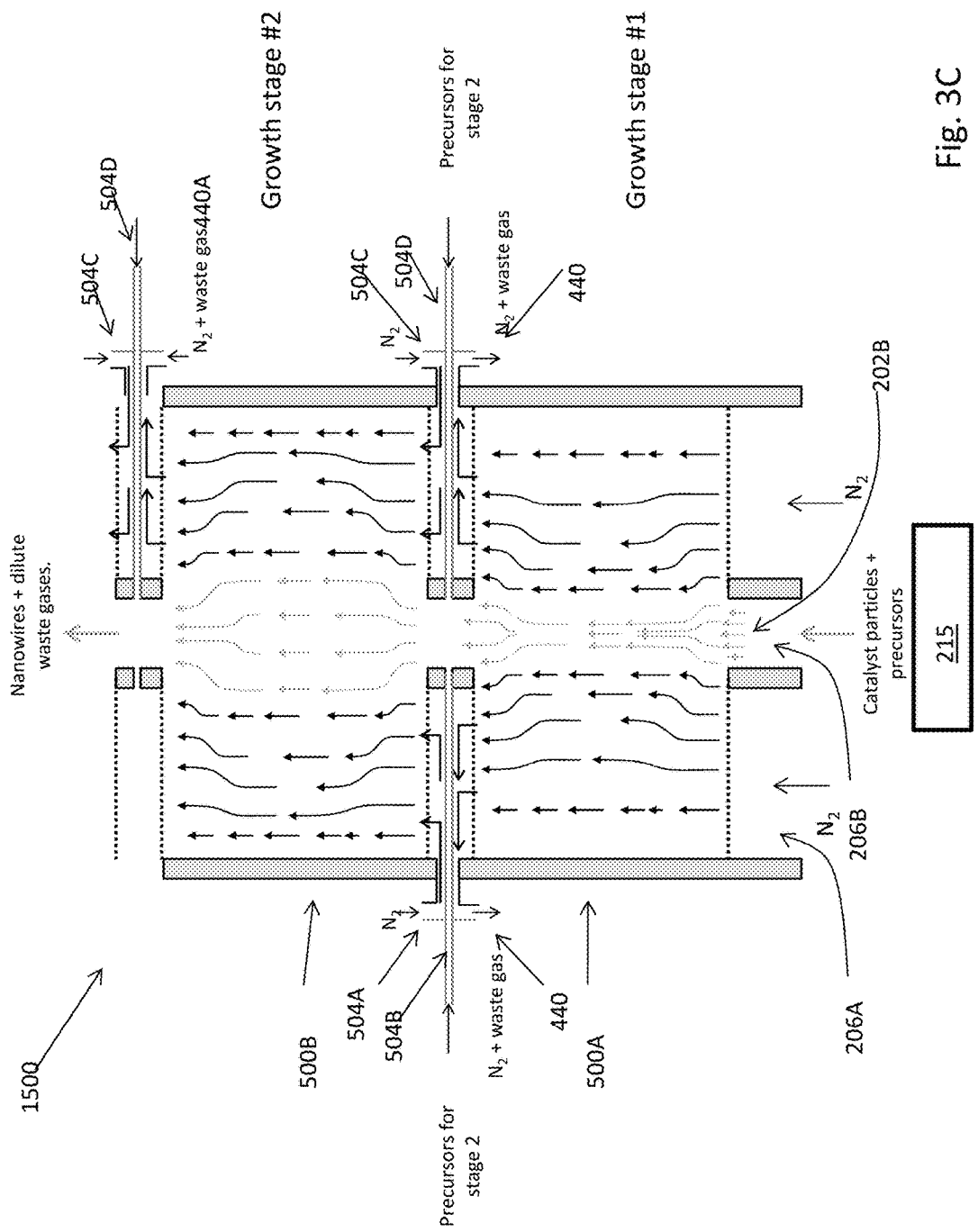
FIG. 3C is a schematic illustration of an exemplary nanowire growth system with stacked nanowire growth reactors.

FIG. 3C illustrates a nanowire growth system 1500 (which may be an Aerotaxy™ nanowire system) with serially connected nanowire growth reactors 500A and 500B (which may be Aerotaxy™ reactors). As illustrated, the nanowire growth system 1500 may include two growth stages, i.e., the system may include two nanowire growth reactors 500A and 500B stacked together. Each of the reactors 500A and 500B may be similar to the reactor 200 shown in FIG. 1, and may include similar elements. For example, each of the reactors 500A and 500B may be configured such that the core flow outlet of the first stage is connected to the core flow inlet of the second stage. The nanoparticles aerosol generator 215 may be disposed upstream of the inlet(s) of the first stage. The elements or features included in the nanowire growth system 1500 may also be included in other system disclosed herein, such as the system 100, 500 (shown in FIG. 6), 700A, and 700B (shown in FIGS. 7A and 7B).

Although for illustrative purposes, only two stages (e.g., two reactors 200) are shown, the nanowire growth system 1500 may have any number of nanowire growth stages, such as three or more stages, by connecting three or more reactors 200. Further, the nanowire growth system 1500 may include any number of, and any combination of nanowire growth reactors 200, 300, and 400 disclosed herein. For example, the nanowire growth system 1500 may be configured with any combination of reactor(s) 200, 300, and/or 400. The nanowire growth system 1500 may have a higher core flow than sheath flow or have a lower core flow than sheath flow. The reactors 500A and 500B may each be similar to the reactor 200, the reactor 300, and/or the reactor 400. Further, by stacking reactors with different relative flow rates, the system may take advantage of the Venturi effect to further vary the size of the core flow.

In some embodiments, the nanowire growth system 1500 may include a gap between adjacent nanowire growth reactors 500A and 500B in the stack through which feed conduits (e.g., 504A, 504B) and gas outlets (e.g., 440) may be provided. For example, a feed conduit 504A may be configured to provide a sheath gas to the outer inlet conduit 206A of the second reactor 500B, while a feed conduit 504B may be configured (e.g., it extends to and/or points at the core flow area between the reactors 500A, 500B) to provide precursor(s) and/or catalytic nanoparticles to the inner inlet conduit 206B of the second reactor 500B. At each stage, the sheath gas and entrained precursor gas (e.g., waste gas) in the sheath gas may be removed with gas outlets 440 and 440A. In this manner, new precursors and sheath gases may be supplied to each new stage and old sheath gas and waste gas may be removed. Additionally, the stages may be stacked vertically, horizontally, or any combination in between. In some embodiments, the entire stack may be enclosed in an outer housing (not shown).

Figure 5:
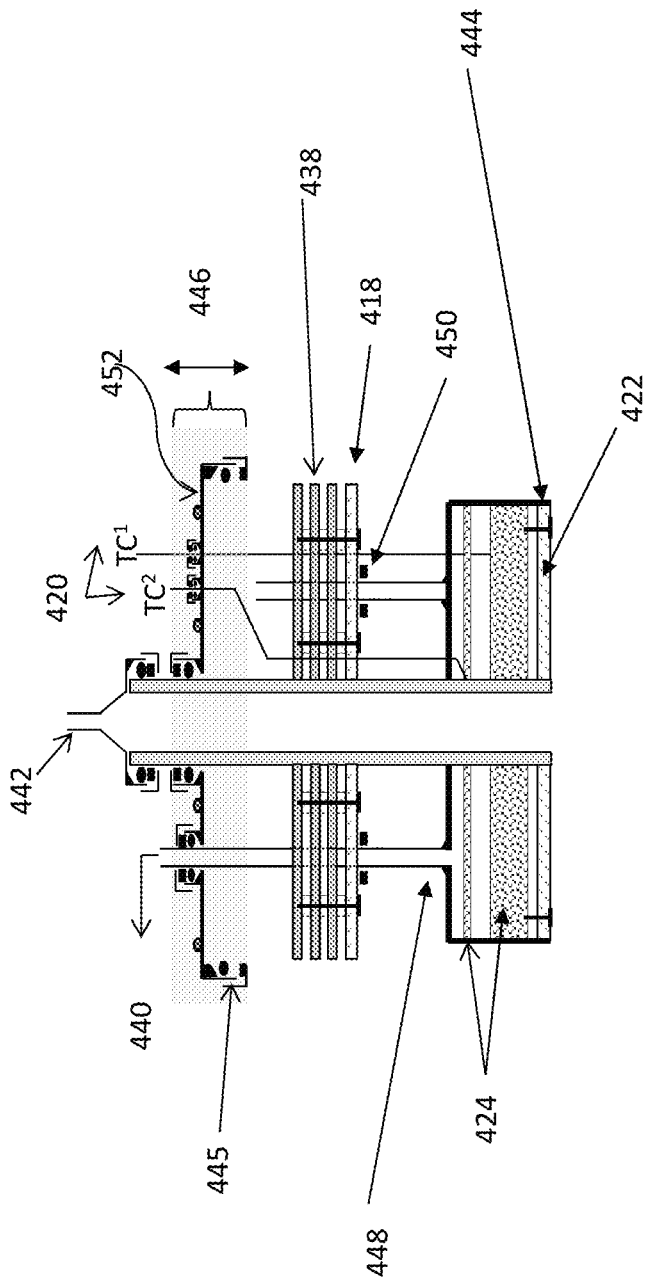
FIG. 5 is a schematic illustration of an exemplary extractor portion of the nanowire growth system of FIG. 4A.

FIGS. 4A, 4B, and 5 illustrate another exemplary nanowire growth system 100 including an exemplary nanowire growth reactor 400. The nanowire growth reactor 400 may be similar to the reactor 200, but may contain additional elements. Elements of the nanowire growth reactor 400 may also be included in the nanowire growth reactors 200 or 300. The reactor 400 may include an outer inlet 402A, an inner inlet 402B, an outer outlet 404A, and an inner outlet 404B. The sheath gas may be provided to a reaction chamber 410 through the outer inlet 402A connected to a sheath gas inlet 432 located in an outer inlet conduit 406A. The catalytic nanoparticles may be aerosolized by the nanoparticles aerosol generator 215, and provided to the reaction chamber 410 through the inner inlet 402B connected to a catalyst inlet 434 located adjacent (e.g., at least partially in) an inner inlet conduit 406B.

One or more precursor gases may be provided to the reaction chamber 410 through the inner inlet 402B connected to a precursor inlet 436 and the inner inlet conduit 406B. Inlets 432, 434, and 436 may comprise any conduits, such as a cylinder, hose, pipe or manifold. Sheath gas inlet 432 may be located adjacent (e.g., at least partially in) the outer inlet conduit 406A. The precursor inlet 436 may be located adjacent (e.g., at least partially in) the inner inlet conduit 406B, with the precursor inlet 436 extending farther up the inner inlet conduit 406B than the catalyst inlet 434. The temperature of the sheath gas, catalytic nanoparticles aerosol, and precursor gases may be monitored at the outer and inner inlets 402A and 402B and in the outer and inner inlet conduits 406A and 406B with one or more thermocouples 420. Although for illustrative purposes, the thermocouples 420 are shown to be located in at least one of the outlet conduits 408A and 408B, the thermocouples 420 may also be located in at least one of the inlets 402A and 402B, or at least one of the inlet conduits 406A and 406B, or at least one of the outlets 404A and 404B.

Heat may be supplied to the outer inlet conduit 406A, a reaction chamber 410, and an outer outlet conduit 408A using one or more heaters 430. To heat the inner inlet conduit 406B, heat may be transferred from the outer inlet conduit 406A to the inner inlet conduit 406B via one or more heat transfer elements 438 located at a lower portion of the reactor 400. To extract heat from an inner outlet conduit 408B, heat may be transferred from the inner outlet conduit 408B to the outer outlet conduit 408A via the one or more heat transfer elements 438 located at an upper portion of the reactor 400. The heat transfer elements 438 may be, for example, disks made of a material with a high thermal conductivity, such as aluminum or copper as shown in FIG. 4B. The distal end (furthest from the reaction chamber 410) of the outer inlet conduit 406A may be provided with a heat shield or insulation 418 (e.g., a material with a low thermal conductivity). The heat shield or insulation 418 may reduce heat loss out of the outer inlet conduit 406A, thereby aiding in maintaining a stable temperature gradient in the outer inlet conduit 406A.

The outer inlet conduit 406A may be provided with one or more fits or filters to provide an equilibrated pressure ensuring a circularly symmetrical plug flow. In some embodiments, the outer inlet conduit 406A may be provided with one or more low porosity frits or filters 424, and/or one or more high porosity frits or filters 422. The low porosity frits or filters 424 may be made of any suitable material such as sintered stainless steel. The high porosity frits or filters 422 may be made of any suitable material, such as metal or ceramic wool or woven fiber such as $SiO_2$, $Al_2O_3$, or steel wool.

The outer outlet conduit 408A may include a cooling collar 426. The cooling collar 426 may include a fluid inlet 428 and a fluid outlet 429. The fluid may be either a liquid or gas. The cooling collar 426 may extract heat from the outer outlet conduit 408A to cool the sheath gas. Additionally, if heat transfer elements 438 are provided adjacent (e.g., within) the outer outlet conduit 408A as discussed above, heat may be extracted from the inner outlet conduit 408B, thereby cooling the unreacted precursor gas(es) and the nanowires. The temperature of the outer outlet conduit 408A and the inner outlet conduit 408B may be monitored using one or more thermocouples 420.

The sheath gas may be removed from the outer outlet 404A via the outer outlet conduit 408A and a gas outlet 440. The sheath gas may be stored in a reservoir. The unreacted precursor gas and the nanowires may be removed from the reactor 400 via an outlet 442 from the inner outlet conduit 408B.

FIG. 5 schematically illustrates an exemplary exit portion of the reactor 400 (which may be an Aerotaxy™ nanowire growth reactor). In some embodiments, the exit portion may be substantially identical to the inlet portion to maintain symmetric gas flow. The exit portion of the reactor 400 may also be included in the nanowire growth system 100 shown in FIGS. 1-3C. The exit portion may include a housing 444. The exit portion may include the high porosity frits or filters 422 and the low porosity frits or filters 424, which may be assembled in the housing 444. The housing 444 may be made of any suitable material, such as stainless steel or molybdenum. Sheath gas flowing from the reaction chamber 410 through the high porosity fits or filters 422 and/or the low porosity frits or filters 424 may be channeled into a conduit or pipe 448. The conduit 448 may pass through a heat shield or insulation 418 and one or more heat transfer elements 438 located adjacent the outer outlet conduit 408A on the way to the sheath gas outlet 440. In some embodiments, the heat shield or insulation 418 and the one or more heat transfer elements 438 may be disposed upstream of the housing 444 (or downstream of the housing 444) with one or more clamps 450 secured to the conduit or pipe 448. Other suitable fastening devices may be used to secure the heat shield or insulation 418 and the heat transfer elements 438 in place, such as screws, bolts and the like.

The size of the reaction chamber 410 may be adjusted by raising or lowering the outer and inner inlets 402A and 402B, the outer and inner outlets 404A and 404B (indicated by range 446), or both. That is, the distance between the outer and inner inlets 402A and 402B, and the outer and inner outlets 404A and 404B may be increased or decreased to adjust the size of the reaction chamber 410. This adjustment can be made by operation of an adjustment mechanism 445, such as a screw, a lever, or any other suitable mechanism. In some embodiments, the adjustment mechanism 445 may raise or lower the outer and inner inlet conduits 406A and 406B, the outer and inner outlet conduits 408A and 408B, and/or a top cap 452 of the assembly 440, 442, 444, 448, and 438 in the outer outlet conduit 408A, such the outlets 404A and 404B from the reaction chamber 410 may be raised or lowered. Alternatively, the size of the reaction chamber 410 may be adjusted by replacing the reactor tubes (e.g., one or more of inlet conduits 206A and 206B and outlet conduits 208A and 208B). In some embodiments, the size of the reaction chamber 410 may be adjusted by replacing the outer conduits 206A and 208A with reactor tubes of different lengths.

Figure 6:
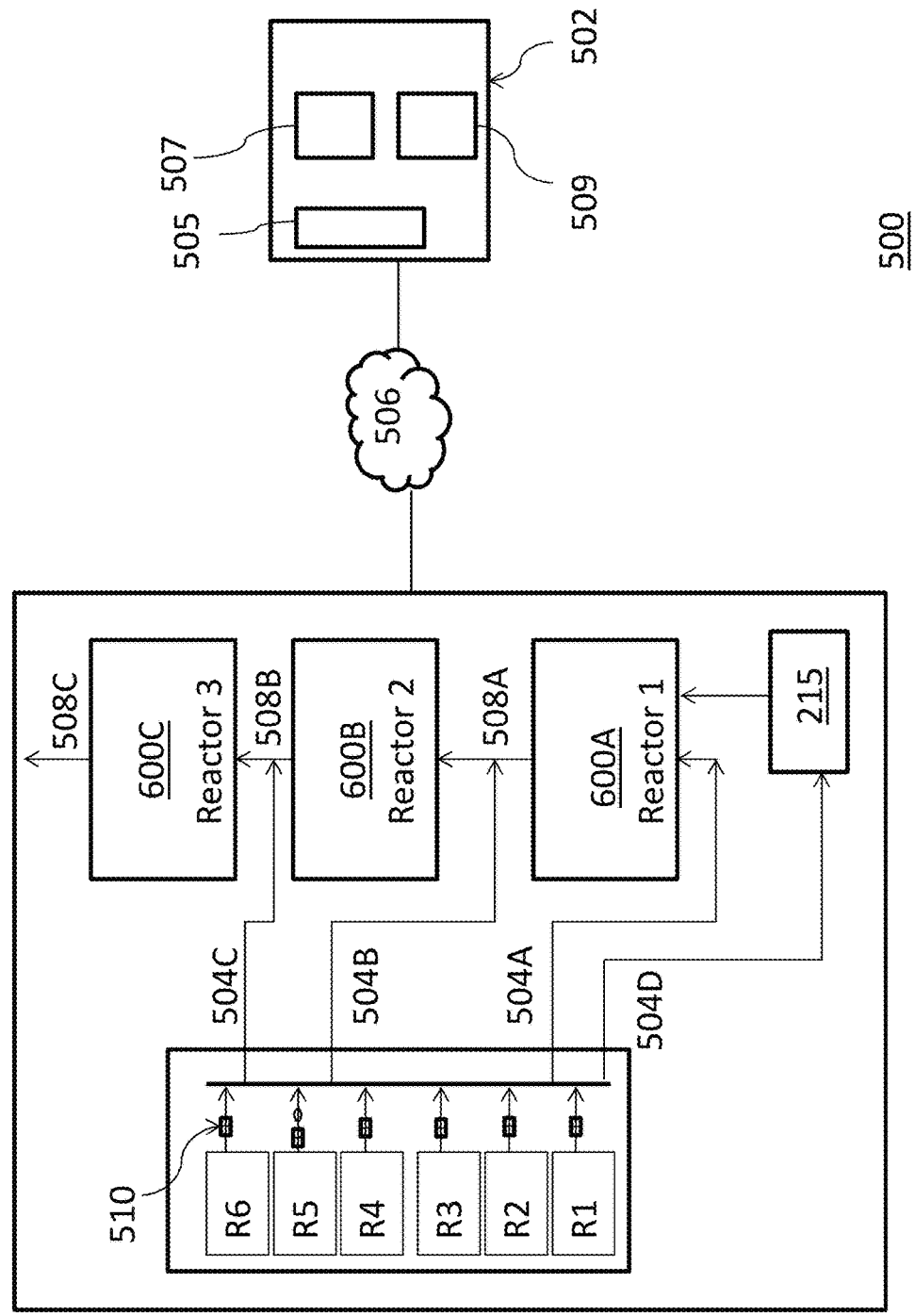
FIG. 6 is a schematic illustration of an exemplary nanowire growth system.

FIG. 6 illustrates an embodiment of a nanowire growth system 500 (which may be an Aerotaxy™ nanowire growth system). For illustrative purposes, the system 500 is shown to include three nanowire growth reactors 600A, 600B, and 600C, although system 500 may include any other suitable number (e.g., two, four, five, etc.) of reactors. Each of the reactors 600A, 600B, and 600C may be similar to any of reactors 200, 300, and 400. The elements or features included in the nanowire growth system 500 may also be included in the systems 100 and 1500 described above, and systems 700A and 700B described below. As illustrated, the three nanowire growth reactors 600A, 600B, and 600C are configured in series. That is, nanowires exiting the first nanowire growth reactor 600A are provided to the second nanowire growth reactor 600B and nanowires exiting from the second nanowire growth reactor 600B are provided to the third nanowire growth reactor 600C. In some embodiments, the nanowire growth reactors may be configured in parallel or in a combination of series and parallel. The connections 508A, 508B between nanowire growth reactors 600A, 600B, and 600C may be made with any suitable conduits, such as pipes, manifolds, hoses or any other suitable connectors. The final nanowires may be harvested via conduit 508C.

Supplies of the sheath gas, precursor gases may be stored in one or more reservoirs. As illustrated, the system 500 may include six reservoirs R1-R6, although any number of reservoirs may be included, such as one, two, three, four, five, or more as desired. A first reservoir R1 may store, for example, a first precursor gas, such as trimethyl gallium or triethyl gallium. A second reservoir R2 may store a second precursor gas, such as arsine or an inert carrier gas, such as nitrogen, argon or helium. A third reservoir R3 may store a third precursor gas, an inert gas (e.g. a sheath gas) or a first dopant gas having a first conductivity type (e.g., p-type or n-type). A fourth reservoir R4 may store a second dopant gas having a second conductivity type (e.g., n-type or p-type) different from the first conductivity type. With this configuration, nanowires may be grown with layers (e.g., core-shells) or regions of different conductivity types. For example, both longitudinally oriented and radially oriented nanowires may be fabricated with the system 500 (and other systems disclosed herein). In this manner, nanowires having one or more pn or p-i-n junctions may be fabricated.

The nanoparticles aerosol generator 215 may be disposed at the inlets of the first reactor 600A, and may generate a catalytic nanoparticles aerosol and supply the aerosol to the first reactor 600A. In some embodiments, a nanoparticles aerosol generator 215 may be disposed at the inlet of each of the reactors 600A, 600B, and 600C. With system 500 and the systems 700A and 700B (discussed below), longitudinally and radially oriented nanowires having one or more pn junctions (or pin junctions) may be fabricated continuously. Raw materials may be continuously provided at a first end of the system (e.g., 500, 700A, or 700B) and finished nanowires may be continuously collected at a second end of the system without having to stop the system. Additionally, because the type and concentration of the gases and the operating conditions may be independently controlled in all of the reactors 600A, 600B, and 600C in the system 500 (and other reactors in other disclosed systems, such as reactors 200 in systems 700A and 700B), both homostructures and heterostructures may be fabricated, such as with respect to composition, doping, and/or conductivity type. Further, the type and concentration of the gases and the operating conditions may be varied as a function of time within a reactor 600A, 600B, and 600C.

The gases may be provided to the reactors 600A, 600B, and 600C through feed conduits 504A, 504B, and 504C. The feed conduits 504A, 504B, and 504C may be pipes, conduits, hoses, manifolds, or any other suitable delivery tubes. As discussed above, the temperature of the reactors 600A, 600B, and 600C may be monitored with one or more thermocouples 420 (shown in FIGS. 4 and 5). Additionally, the gas flow from the reservoirs R1-R6 to the reactors 600A, 600B, and 600C may be monitored with flow control devices 510, which may include one or more meters and/or flow control valves. The flow control devices 510 may be configured to provide information about the flow rate and/or the total amount of flow. The flow meters or valves 510 may also be configured to control the flow rate and/or the total amount of the flow. In some embodiments, separate flow meters and flow control valves may be provided. In some embodiments, the flow meters and flow control valves may be integrated within the flow control devices 510. In some embodiments, one or more gases from one or more reservoirs R1-R6 may be supplied to the nanoparticles aerosol generator 215 through feed conduits 504D. Although not shown, one or more flow control devices, which may be similar to the flow control device 510, may be provided to control the aerosol flow from the nanoparticles aerosol generator 215, and/or the gas flow supplied to the nanoparticles aerosol generator 215.

The nanowire growth system 500 may include a controller 502, such as a personal computer, server, or special purpose computing device. Similar controllers may also be included in the systems 100 and 1500 (shown in FIGS. 1-4B), and systems 700A and 700B (shown in FIGS. 7A and 7B). The controller 502 may include hardware components, software components, or both. For example, the controller 502 may include a communication unit 505 configured to communicate with various devices or components (e.g., flow control devices 510, reactors 600A-600C, etc.) included in the nanowire growth system 500. The communication unit 505 may communicate with the various devices or components through a network 506, which may be a wired network (e.g., Ethernet) or wireless network (e.g., WiFi network, cellular network, radio frequency network, etc.). The communication unit 505 may include at least one hardware component, such as a communication port, antenna, etc.

The controller 502 may include a memory 507 configured to store computer executable instructions and/or codes, such as computer programs. The memory 507 may be any suitable tangible memory, such as, for example, a flash memory, a Read-Only Memory (ROM), a Random-Access Memory (RAM), etc. The memory 507 may include at least one hardware component, such as a semiconductor, a hardware circuit, etc.

The controller 502 may include a processor 509. The processor 509 may be configured to execute the instructions or codes to perform various methods or processes disclosed herein. The processor 509 may include at least one hardware component, such as, for example, a hardware circuit, a semiconductor, etc. The processor 509, the memory 507, and the communication unit 505 may communicate with one another via buses, wires, and/or other communication means.

The controller 502 may communicate with various devices or components disclosed herein in the reactors (e.g., 200, 300, 400, etc.) or systems (e.g., 500, 700A, 700B, 1500, etc.). The controller 502 may receive data or signals from the various devices or components, analyze the data, and send control signals to the various devices or components to control the operations of the nanowire growth reactors or systems. For example, the controller 502 may be configured to receive data or signals from and send control signals to at least one of the heaters 214, 216, and 230 to adjust the temperature in the reactors 200 (or 300, 400, etc.). The controller 502 may receive temperature measurements from the one or more thermocouples 420 (e.g., the controller 502 may monitor the temperature measurements of the thermocouples 420). For example, the controller 502 may adjust at least one of the heaters 214, 216, and 230 based on the temperature measurements received from the thermocouples 420. The controller 502 may be configured to receive data or signals from the flow control devices 510 and to send control signals to the flow control devices 510 to adjust the flow of the gases supplied to the reactors and/or the nanoparticles aerosol generator 215.

Figure 7:
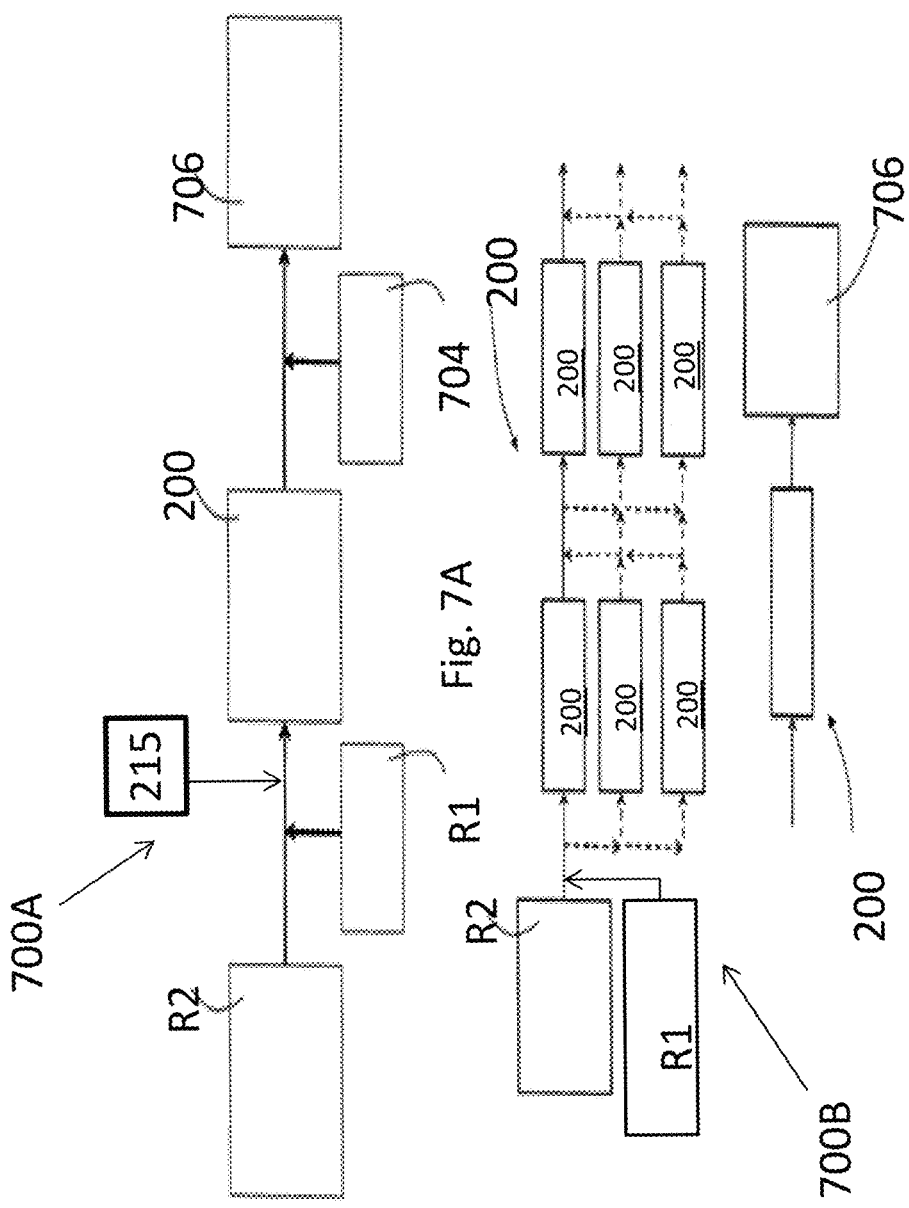
FIG. 7A is a schematic illustration of another exemplary nanowire growth system.
FIG. 7B is a schematic illustration of a variation of the embodiment of FIG. 7A.

FIGS. 7A and 7B illustrate exemplary nanowire growth systems 700A and 700B (which may be Aerotaxy™ nanowire growth systems). The system 700A may include a first reservoir R1 configured to deliver a precursor gas to the reactor 200 (or 300, 400). In some embodiments, the nanoparticles aerosol generator 215 may be included to provide a catalytic nanoparticles aerosol to the reactor 200. One or more gases stored in the reservoir R1 may be supplied to the nanoparticles aerosol generator 215. The system 700A may include a second reservoir R2 configured to deliver a sheath gas. The sheath gas may be a second precursor gas or an inert gas, e.g., nitrogen or a noble gas such as helium or argon.

The system 700A may further include a particle analyzer 704, which may provide in-situ analysis of the nanowires or the partly grown nanowires to obtain the desired nanowire properties. The particle analyzer 704 may operate, for example, by illuminating the nanowires and detecting the luminescence from the nanowires to determine optical properties of the nanowires. In-situ analysis provides the ability to obtain feedback (e.g., the sizes of the nanowires) to be used in a feedback control loop that is otherwise not available in substrate-based synthesis of nanowires. The feedback may be used, e.g., by a controller (e.g., controller 502), to control wire growth, such as by controlling the sizes of the catalytic seed particles, as well as control of growth conditions by controlling one or more parameters associated with: precursor composition, precursor molar flow, carrier gas flow, temperature, pressure or dopants, in one or more of the reaction chambers. After nanowire growth, the nanowires may be provided to a nanowire repository 706 (e.g. a container for storage of the nanowires or a nanowire deposition apparatus containing a substrate).

In the embodiment illustrated in FIG. 7B, the system 700B may include a first reservoir R1 and a second reservoir R2. The first reservoir R1 may be configured to provide a precursor gas and the second reservoir R2 configured to provide a sheath gas. In this embodiment, the system 700B may include a plurality of reactors 200 (or 300, 400) configured in series and in parallel. Although not shown, each reactor 200 (or 300, 400) may be provided with a nanoparticles aerosol generator 215 to provide a catalytic nanoparticles aerosol. In addition, a controller (e.g., controller 502) may be included in the system 700B.

With system 700B, a large number of nanowires may be fabricated simultaneously. Further, each parallel line of reactors 200 may be operated under different conditions from the other lines of reactors 200 in the system 700B. In this manner, different configurations of nanowires, e.g., longitudinally oriented and horizontally oriented, may be produced simultaneously. In another aspect, different conduits of reactors 200 may be provided with nanoparticles of different sizes or the nanoparticles aerosol generators 215 associated with the reactors 200 may be configured to generate nanoparticles of different sizes. In this manner, nanowires having different sizes (e.g., diameters, lengths) may be fabricated at the same time without being comingled. Optionally, the system 700B illustrated in FIG. 7B may include one or more particle analyzers 704 to monitor the nanowire growth in one or more of the conduits of reactors 200.

The nanowire growth reactors disclosed herein (e.g., 200, 300, 400) may be aligned horizontally or vertically. For example, for a vertical alignment of a nanowire growth system including two reactors 200, the outer inlet 202A and the inner inlet 202B of a second reactor 200 may be vertically aligned with the outer outlet 204A and inner outlet 204B of a first reactor 200, respectively. In systems 1500, 500, 700A, and/or 700B, with multiple nanowire growth reactors 500A, 500B, 600A-600C, 700A, and/or 700B (each of which may be one of reactors 200, 300, or 400), the nanowire growth reactors are shown to be vertically stacked, although they may also be horizontally stacked, or stacked at any angle between the horizontal and vertical directions.

Figure 8:
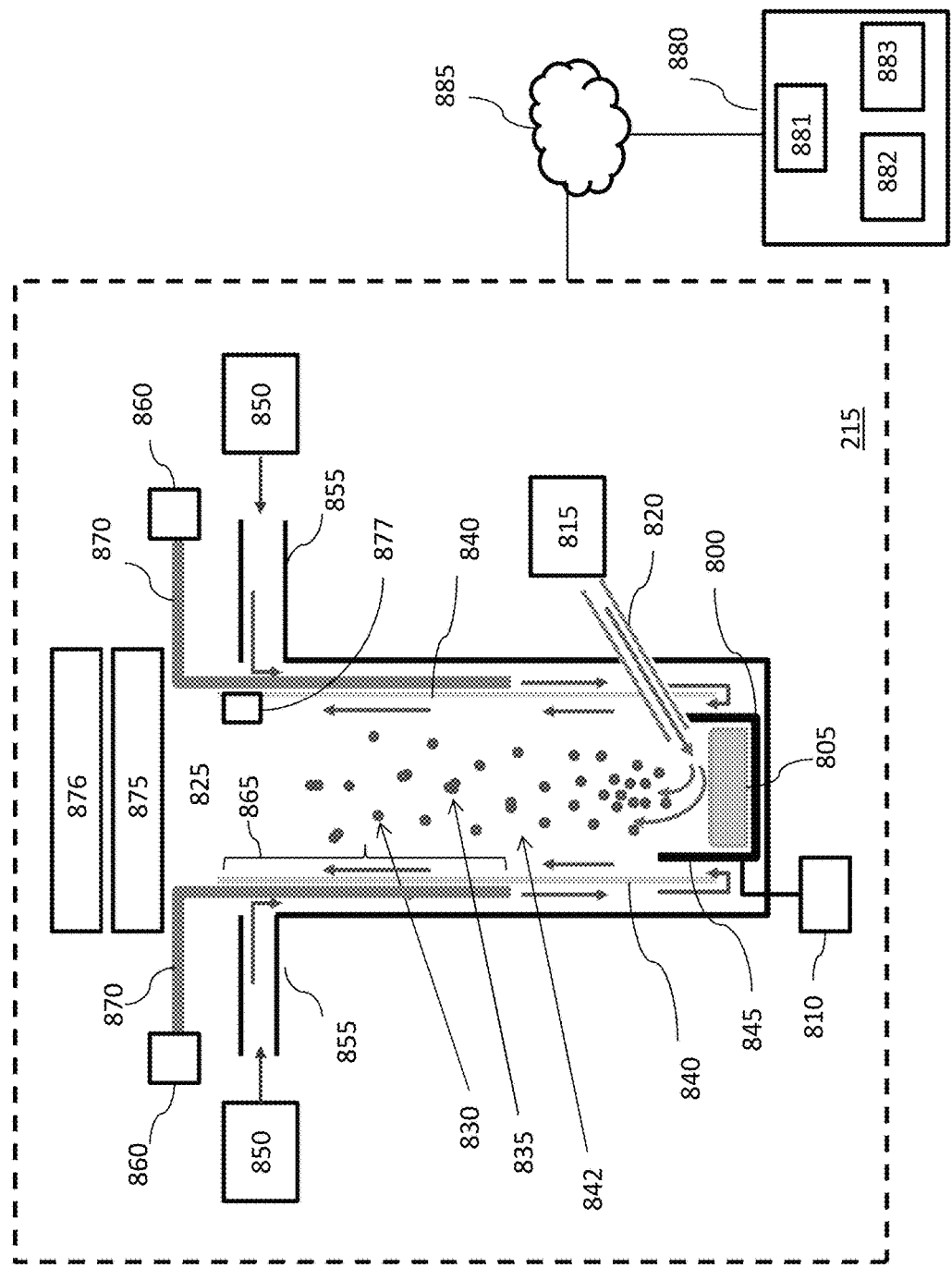
FIG. 8 is a schematic illustration of an exemplary nanoparticles aerosol generator that may be used in the nanowire growth system.
Figure 9:
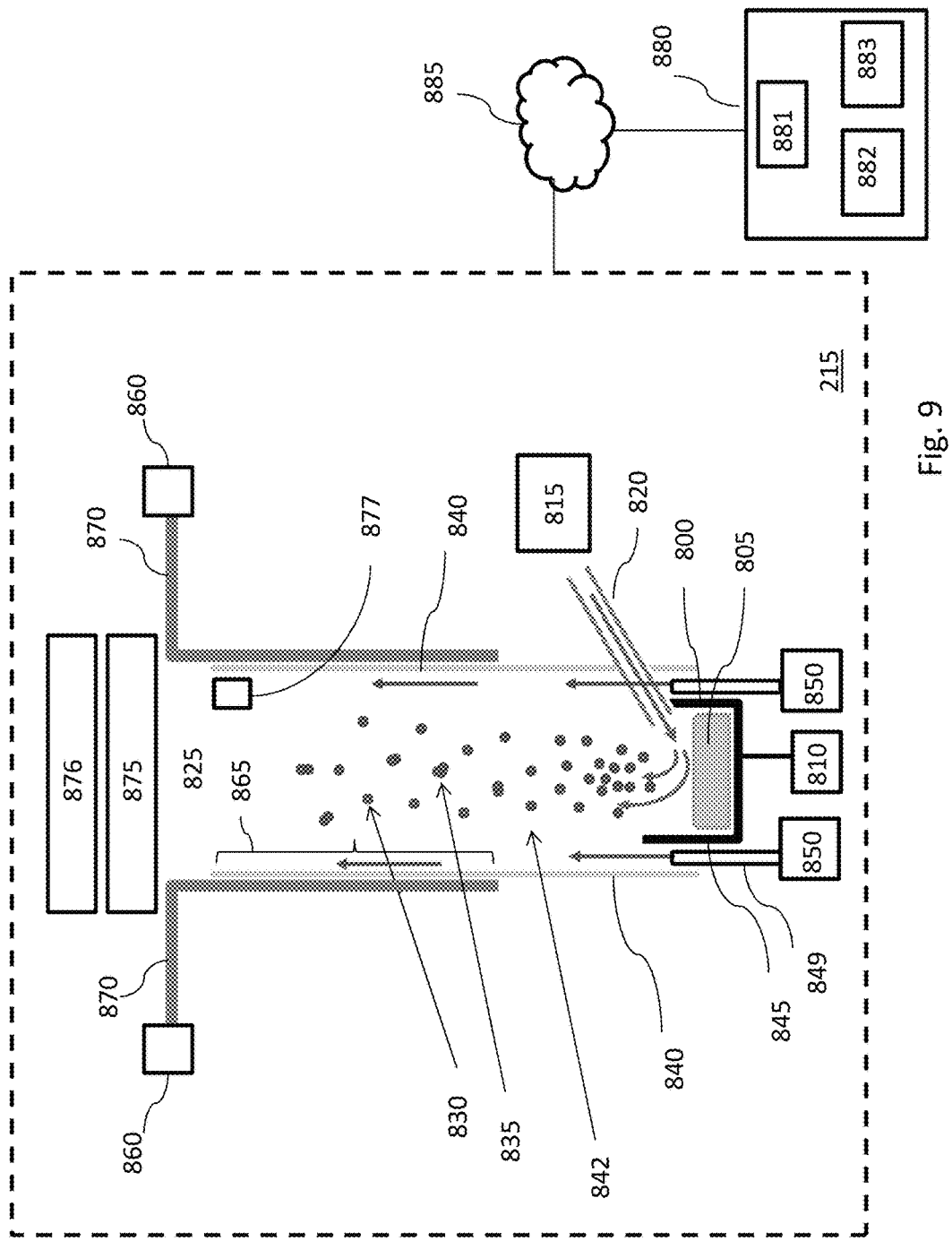
FIG. 9 is a schematic illustration of another exemplary nanoparticles aerosol generator that may be used in the nanowire growth system.
Figure 10:
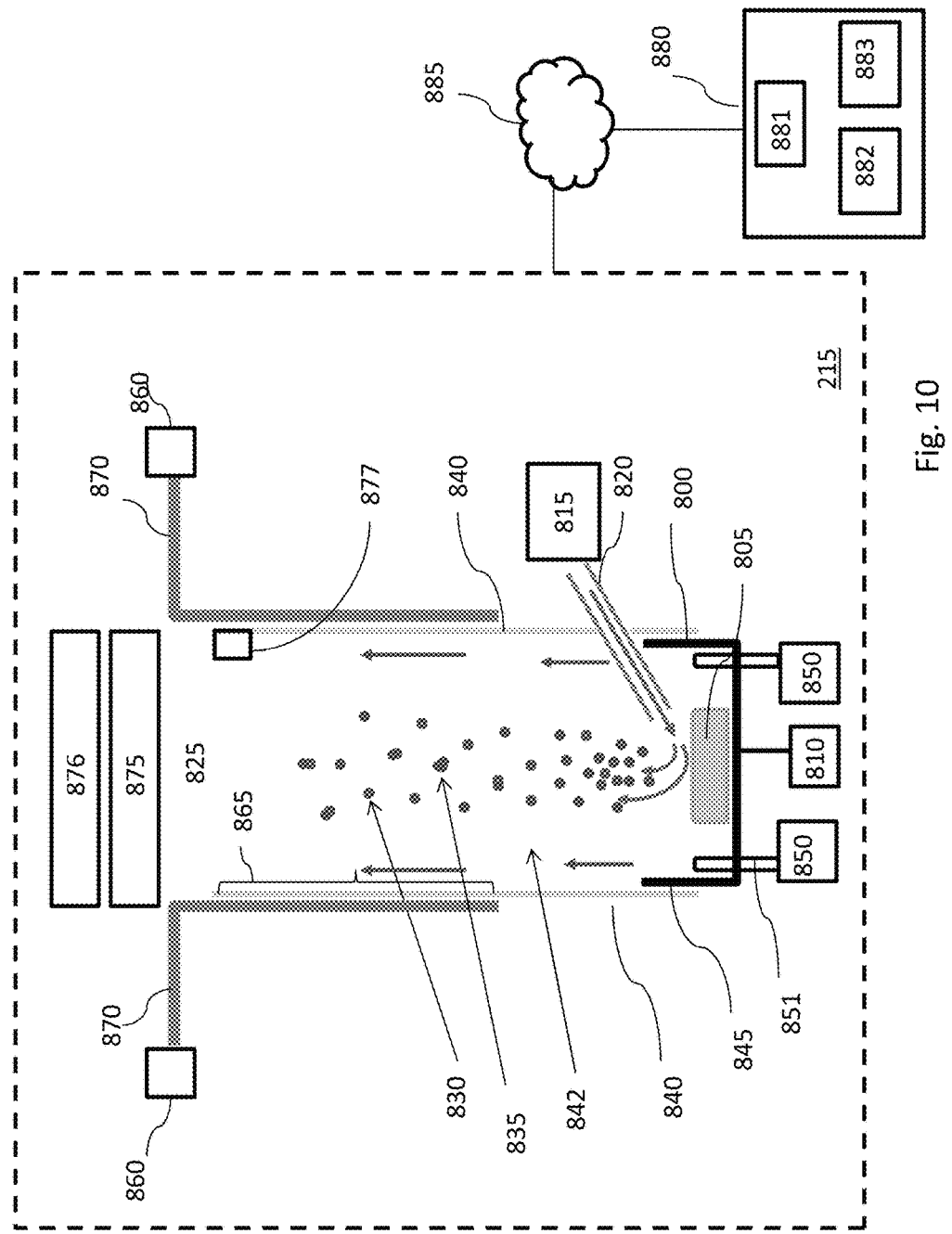
FIG. 10 is a schematic illustration of another exemplary nanoparticles aerosol generator that may be used in the nanowire growth system.

FIGS. 8-10 schematically illustrate exemplary nanoparticles aerosol generators 215, which may be used with the nanowire growth reactors and systems disclosed herein. The embodiments shown in FIGS. 8-10 may include similar or the same elements, except for the configurations for supplying the dilution gas. For similar or the same elements, below discussions may only refer to FIG. 8, although the same descriptions also apply to similar or the same elements included in the embodiments of FIGS. 9 and 10.

Referring to FIGS. 8-10, the nanoparticles aerosol generator 215 may be configured to generate a nanoparticles aerosol and provide the nanoparticles aerosol to the inlets of a nanowire growth reactor (e.g., reactor 200, 300, 400, or the reactors included in systems 500, 1500, 700A, and 700B). The nanoparticles aerosol generator 215 may be configured to generate the catalytic nanoparticles that are used in the reactors. The nanoparticles aerosol generator 215 may be configured to generate the catalytic nanoparticles having a size of greater than 100 nm (e.g., 100 nm-200 nm or greater than 200 nm), having a narrow size distribution (e.g., having a standard deviation<10% mean), and a high density (e.g., greater than $10^7$ particles/cm$^3$, such as $10^8$ particles/cm$^3$). The nanoparticles aerosol generator 215 may also be configured to generate the catalytic nanoparticles having other size (e.g., less than 100 nm, 10-200 nm), other size distribution (e.g., a wider size distribution having a standard deviation>10% mean), and/or other density (e.g., lower than $10^7$ particles/cm$^3$, such as $10^6$ particles/cm$^3$, or $10^5$ particles/cm$^3$). The nanoparticles aerosol generator 215 may also be configured to generate particles that are smaller than or larger than the nanoscale.

As shown in FIGS. 8-10, the nanoparticles aerosol generator 215 may include a container 800. In some embodiments, the container 800 may be a crucible. Other containers may also be used. For discussion purposes, crucible is used as an example of the container 800. The crucible 800 may be configured to contain a source material 805. The source material 805 may be a metal source material, such as, for example, Au, Ag, Cu, Fe, Ni, Ga, In, Al, or any combination thereof, which may function as a catalyst for growing nanowires. The source material 805 may be heated to evaporate. In some embodiments, the source material 805 may be heated up to 2000° C. In some embodiments, the source material 805 may be heated to more than 2000° C. Heating the source material 805 may be achieved using a heating device 810 through various methods, such as thermal heating, electric arc heating, induction heating, etc. Other methods to evaporate the source material 805 may also be used, such as laser evaporation methods.

In some embodiments, heating the source material 805 may be achieved by thermal heating. The heating device 810 may heat the crucible 800, which in turn heats the source material 805. In some embodiments, heating the source material 805 may be achieved by electric arc heating. The heating device 810 may apply an electric arc current to the source material 805 to increase the temperature of the source material 805. In some embodiments, heating the source material 805 may be achieved by electric induction heating. The heating device 810 may apply an alternating electric current to a plurality of coils (not shown) surrounding the crucible 800 to heat the source material 805 under induction generated by the alternating current in the coils.

When heated to a certain temperature or higher, a portion of the heated source material 805 (e.g., the top surface portion) may become vaporized (e.g., heated source material 805 may melt and disintegrate into small particles at least at its top surface). Higher temperature may cause more nanoparticles of the source material 805 to become vaporized when the heated source material 805 is blown by a carrier gas flow. Thus, higher temperature may result in higher density for the generated nanoparticles aerosol.

As shown in FIGS. 8-10, the nanoparticles aerosol generator 215 may include a carrier gas source 815 configured to supply a flow of a carrier gas into the crucible 800 through a conduit 820. The conduit 820 may be configured to point at the source material 805 at an angle, such that the carrier gas may be blown to the source material 805 at the angle. The angle of the conduit 820 may be fixed or may be adjusted. The carrier gas may be blown to a top surface of the source material 805 to cause the nanoparticles of the source materials to rise and separate from the source material 805. When the carrier gas is blown to the top surface of the source material 805, an aerosol (e.g., vapor) may be formed by the carrier gas and the small particles (e.g., nanoparticles) of the source material 805. The carrier gas may be any suitable carrier gas, such as, for example, nitrogen, hydrogen, and noble gases such as helium and argon, or a mixture thereof.

Although one carrier gas source 815 and one conduit 820 are shown in FIG. 8, the nanoparticles aerosol generator 215 may include at least one other pair of carrier gas source and conduit on the left side. The additional pair of carrier gas source and conduit may be disposed symmetrically with respect to the carrier gas source 815 and the conduit 820. In some embodiments, the additional pair of carrier gas source and conduit may not be symmetrically located with respect to the carrier gas source 815 and the conduit 820.

The vapor (e.g., nanoparticles aerosol) may flow from the crucible 800 toward an exit 825 of the nanoparticles aerosol generator 215 within an evaporation chamber 842. Various parameters of the carrier gas flow may affect the size of the nanoparticles, the particle concentration (e.g., density and/or size distribution), and the total material transport. The various parameters may include the type of the carrier gas, the flow rate, the total amount of the flow, the angle of the conduit 820 pointing to the source material 805.

The nanoparticles aerosol adjacent the crucible 800 may have a high density, and the particles may tend to coagulate with one another to form clusters. The particle clusters may not be suitable or desirable for the downstream use in the reactors. As shown in FIG. 8, two types of particles may coexist in the nanoparticles aerosol, one being primary particles 830, another being coagulated particle clusters 835. The primary particles 830 may be used for downstream use in the reactors. The coagulated particle clusters 835 may be discarded when the size of the clusters 835 is outside of the desired size distribution.

The density of the nanoparticles aerosol may be affected by the temperature of the source material 805. The higher the temperature of the source material 805, the higher the density of the nanoparticles aerosol. The density of the nanoparticles aerosol may also be affected by the carrier gas, such as the flow rate of the carrier gas. In some embodiments, greater flow rate of the carrier gas may result in higher the density.

Higher density may result in more coagulation among the nanoparticles. Thus, to control the coagulation, the density of the nanoparticles aerosol may be controlled. The density of the nanoparticles aerosol may be controlled by controlling at least one of the temperature of the source material 805 and the carrier flow. For example, the temperature of the source material 805 may be controlled by controlling the heating by the heating device 810, for example, the arc current applied by the heating device 810. The carrier gas flow may be controlled by controlling a flow control valve (not shown) to regulate the flow rate and/or the amount of the carrier gas flow supplied to the crucible 800.

The nanoparticles aerosol generator 215 may include a wall 840. Inner surfaces of the wall 840 may define the evaporation chamber or flow path 842 extending from the crucible 800 to the exit 825 for the vapor (e.g., nanoparticles aerosol) to flow. The wall 840 may be a wall of a tube or pipe, or may include multiple walls connected together to form the chamber 842. The wall 840 may be disposed at least partially surrounding the crucible 800 such that nanoparticles aerosol may flow from the crucible 800 to the exit 825 along the chamber or flow path 842 defined by the wall 840. The wall 840 may have an overlap with a wall 845 of the crucible 800, defining a space between the wall 845 and the wall 840 as shown in FIG. 8.

As shown in FIGS. 8-10, to further control coagulation, thereby controlling size distribution of the nanoparticles to achieve a desired range, the nanoparticles aerosol generator 215 may use a second, separate gas stream to dilute the nanoparticles aerosol formed by the carrier gas flow and the nanoparticles generated from the source material 805. As shown in FIGS. 8-10, the nanoparticles aerosol generator 215 may include a dilution gas source 850 configured to supply a dilution gas. The dilution gas may be any suitable gas, such as, for example, nitrogen, hydrogen, and noble gases such as helium and argon, or a mixture thereof. The dilution gas may or may not be the same as the carrier gas. In some embodiments, the dilution gas may be introduced into the chamber 842 at a location away from the crucible 800. For example, unlike the carrier gas, the dilution gas may not be blown toward the crucible 800, and therefore, may not affect the formation of the nanoparticles from the source material 805. The carrier gas flow and the dilution gas flow may be supplied separately into the chamber 842. By diluting the nanoparticles aerosol generated by the carrier gas flow, coagulation may be reduced due to the increased coagulation time for the nanoparticles suspended in the diluted aerosol.

In the embodiment shown in FIG. 8, the dilution gas may be supplied from the dilution gas source 850 to a conduit 855, which may be disposed outside of the wall 840 and extend along at least a portion of the wall 840. As shown in FIG. 8, the conduit 855 may include a portion that is substantially in parallel with the wall 840 and extending beyond the wall 840 at a location adjacent the crucible 800. The dilution gas may flow downwardly within the conduit 855 in parallel with the wall 840 toward the crucible 800. As the dilution gas flow reaches the lower end of the wall 840, the dilution gas flow may turn around the bottom of the wall 840 or through apertures in the wall 840, and flow upwardly along the inner surface of the wall 840 to form a shield along the inner surface of the wall 840. The dilution gas flow shield may reduce wall deposition caused partly by thermophoresis (e.g., reducing the amount of hot particles depositing on relatively colder wall 840). The dilution gas flow shield may separate the wall 840 and the nanoparticles aerosol formed by the carrier gas flow and the nanoparticles, thereby preventing the hot nanoparticles from depositing on the wall 840, and diluting the nanoparticles aerosol. The configuration of the wall 840 and the conduit 855 may enable the dilution gas to flow along the inner surface of the wall 840, while introducing as little disturbance to the carrier gas flow as possible (e.g., there is no or little cross flows between the dilution gas flow and the carrier gas flow).

Other configurations for supplying the dilution gas can also be used. For example, in the embodiment shown in FIG. 9, the dilution gas flow may be supplied from a lower or bottom portion of the nanoparticles aerosol generator 215, e.g., a portion adjacent the crucible 800. The dilution gas may be supplied directly to the flow path from the bottom portion of the wall 840, e.g., via a conduit 849 inserted into the space between the wall 840 and the wall 845 of the crucible 800. The dilution gas supplied through the space between the wall 840 and the wall 845 of the crucible 800 may continue to flow upwardly along the wall 840 to form a shield between the wall 840 and the nanoparticles aerosol (e.g., the carrier gas flow with the nanoparticles), and to dilute the nanoparticles aerosol.

In another embodiment shown in FIG. 10, the dilution gas may be supplied to the flow path via a dilution gas inlet conduit 851. The inlet conduit 851 may be disposed at any suitable location, and may or may not be straight (e.g., it may be bent with an angle). For example, the inlet conduit 851 may be located at least partially within the crucible 800, e.g., in a space adjacent the wall 845 of the crucible 800 or adjacent the source material 805. In some embodiments, as shown in FIG. 10, the inlet conduit 851 may be disposed at a bottom side of the crucible 800, such that the dilution gas flows upwardly along with the nanoparticles aerosol generated by the carrier gas and the source material 805. The dilution gas flow may form a shield between the nanoparticles aerosol and the wall 840, and may also dilute the nanoparticles aerosol. The depth of the inlet extending from the bottom side of the crucible 800 into the flow path may be configured to be any suitable depth, such that the dilution gas is discharged into the flow path to dilute the nanoparticles aerosol at a desired starting location. In some embodiments, the starting location may be above the top surface of the source material 805. In some embodiments, the conduit 851 may point straight upward, as shown in FIG. 10. In some embodiments, the conduit 851 may pointing toward the wall 840 at an angle (e.g., 5 degrees, 10 degrees, etc.), such that the dilution gas may be blown toward the wall 840 at the angle, and continue to flow substantially along the inner surface of the wall 840, forming a shield between the wall 840 and the nanoparticles aerosol, and diluting the nanoparticles aerosol.

The inlet conduit 851 may be located at any other suitable location of the crucible 800, such as, for example, the side wall 845 of the crucible 800. In such configurations, the inlet conduit 851 may include a bent conduit with a desired angle (e.g., a 90 degrees angle). The bent conduit 851 may include a discharging port pointing upward, such that the dilution gas may be discharged into the chamber upwardly to flow substantially along the inner surface of the wall 840, thereby forming a shield between the wall 840 and the nanoparticles aerosol, and diluting the nanoparticles aerosol.

After being supplied into the evaporation chamber 842 using various configurations shown in FIGS. 8-10 and described above, the dilution gas may flow substantially along the wall 840 to form a shield between the wall 840 and the nanoparticles aerosol, and to dilute the nanoparticles aerosol, thereby reducing the density. Due to the reduced density, nanoparticles carried in the diluted nanoparticles aerosol may be less likely to coagulate with one another to form clusters. Thus, coagulation may be controlled by controlling the dilution gas flow. For example, the flow rate of the dilution gas flow may be controlled to adjust the coagulation. Controlling the coagulation may also aid in controlling the size distribution of the nanoparticles to achieve a desired size distribution range. With reduced coagulation, more nanoparticles generated from the source material 805 may pass through a downstream differential mobility analyzer (DMA), which in turn improves control of size distribution.

The location where the dilution gas is supplied into the chamber 842 defined by the wall 840 to dilute the carrier gas that carries the nanoparticles may be configured at to be any suitable location. For example, in some embodiments, the dilution gas may be flown into the chamber 842 adjacent the crucible 800, such that the primary nanoparticles may be immediately diluted after formation, thereby suppressing the coagulation to control the size distribution. The dilution gas may also be supplied into the chamber 842 at other locations, such as between the crucible 800 and the cooling zone 865.

Referring to FIGS. 8-10, the nanoparticles aerosol generator 215 may include a cooling device 860 configured to provide a cooling fluid (e.g., water, a cooling gas, or another suitable cooling fluid) to cool a cooling zone 865, which may include a portion of the wall 840, and a portion of the evaporation chamber 842 formed by the portion of the wall 840. Within the cooling zone 865, the temperature of a portion of the nanoparticles aerosol (including the dilution gas flow and the carrier gas flow with the nanoparticles) may also be reduced. With the temperature of the nanoparticles aerosol reduced within the cooling zone 865, the mobility of the nanoparticles may be reduced, thereby reducing the coagulation. In some embodiments, the cooling fluid may be circulated within a conduit 870 (e.g., a copper pipe, etc.) disposed along and adjacent the outer surface of the wall 840. The location of the cooling zone 865 may be configured (e.g., through configuring the location of the conduit 870) to be close to the source material 805, or close to the exit 825. It may also be desirable to reduce the temperature of the nanoparticles aerosol prior to the exit 825, such that a substantially constant temperature (e.g., room temperature) is maintained upstream of a differential mobility analyzer 875 (described below) (e.g., before the nanoparticles aerosol enters the differential mobility analyzer 875).

With the temperature reduced, the movement of the nanoparticles may be less active, which means that the residence time in the chamber 842 may be reduced. Thus, coagulation may be reduced in the nanoparticles aerosol. However, at reduced temperatures, the density of the nanoparticles may also be reduced. Therefore, there is a compromise between reducing the coagulation and maintaining a high density. The cooling device 860 may be controlled to achieve a desired compromise. Moreover, within the zone where the cooling conduit 870 is not located (e.g., the zone closer to the crucible 800), the temperature of the nanoparticles aerosol is higher than that of the cooling zone 865. Thus, there is a temperature gradient within the flow path from the crucible 800 to the exit 825. Large temperature gradients may create turbulence within the nanoparticles aerosol, which may in turn cause more coagulation.

Referring to FIGS. 8-10, the nanoparticles aerosol generator 215 may be associated with, or may include, a differential mobility analyzer (DMA) 875. The DMA 875 may be configured to perform size selection, i.e., to select the particles whose sizes fall within a predetermined size distribution range (e.g., 100 nm-150 nm, 100 nm-200 nm, 200-250 nm, etc.). The nanoparticles selected by the DMA 875 may be provided to downstream reactors (e.g., 200, 300, 400) or systems (e.g., 500, 1500, 700A, and 700B). For example, the DMA 875 may include an inlet connected to the exit 825 of the nanoparticles aerosol generator 215. In some embodiments, the DMA 875 may include an outlet connected with the inlet of a reactor (e.g., the inner inlet 202B of the reactor 200, the inner inlet 302C of the reactor 300, the inlet 402B of the reactor 400, etc.). In some embodiments, the DMA 875 may be connected with a downstream particle counting device 876 before the size-selected nanoparticles aerosol is supplied to the inlets of the reactors. In some embodiments, the particle counting device 876 may be integral with the DMA 875 as a single unit.

The DMA 875 may generate an electric field. As the nanoparticles travel through the DMA 875, they may move according to their electrical mobility. Only nanoparticles having a size (e.g., diameter) within the predetermined size distribution range may pass through the DMA 875. The predetermined size distribution range may be adjusted in the DMA 875, e.g., by a controller 880 (described below) or the controller 502. In the embodiments shown in FIGS. 8-10, by using the dilution gas flow to dilute the nanoparticles aerosol, thereby reducing coagulation, more nanoparticles may pass through the DMA 875. Thus, material utilization rate may be increased.

Referring to FIGS. 8-10, the nanoparticles aerosol generator 215 may also include or otherwise be associated with a particle counting device 876. The particle counting device 876 may be disposed downstream of the DMA 875, and may be configured to count the number of particles in the nanoparticles aerosol output from the DMA 875 after size selection. The number of particles counted by the particle counting device may indicate the density of the nanoparticles. The particle counting device 876 may be a unit separate from the DMA 875, or may be integral with the DMA 875 as a single unit.

Referring to FIGS. 8-10, the nanoparticles aerosol generator 215 may include a thermocouple 877. The thermocouple 877 may be similar to the thermocouples 420. The thermocouple 877 may be configured to measure the temperature gradient within the evaporation chamber 842, e.g., from the source material 805 to the exit 825. In some embodiments, the thermocouple 877 may include one electrode disposed adjacent the crucible 800 (e.g., near the source material 805), another electrode disposed adjacent the exit 825 or any other suitable location. Although only one thermocouple 877 is shown in the embodiments of FIGS. 8-10, more than one thermocouple 877 may be included. In some embodiments, the thermocouples 877 may not directly measure the temperature gradient, but instead, may measure temperature of the nanoparticles aerosol and the controller 880 or the controller 502 may use the temperature measurement to calculate the temperature gradient.

Referring to FIGS. 8-10, the nanoparticles aerosol generator 215 may be controlled by a controller 880. The controller 880 may be part of the controller 502, or may be a separate controller dedicated for controlling the nanoparticles aerosol generator 215. The controller 880 may include hardware components, software components, or both. For example, the controller 880 may include a communication unit 881 configured to communicate with various devices or components included in the nanoparticles aerosol generator 215, such as the heating device 810, the cooling device 860, the carrier gas source 815, the dilution gas source 850, the DMA 875, the particle counting device 876, and/or the thermocouple 877. The communication unit 881 may communicate with the various devices or components through a network 885, which may be a wired network (e.g., Ethernet) or wireless network (e.g., WiFi network, cellular network, radio frequency network, etc.). The communication unit 881 may include at least one hardware component, such as a communication port, antenna, etc. The controller 880 may receive data or signals from the various devices or components, and may send control signals to the various devices or components to adjust operational parameters. The controller 880 may communicate with other controllers (e.g., controller 502) of the nanowire growth system, in which the nanoparticles aerosol generator 215 may be used.

Referring to FIGS. 8-10, the controller 880 may implement various control methods to control the size distribution and/or the density of the nanoparticles. In some embodiments, the controller 880 may implement an open control (e.g., a feed forward control). In some embodiments, the controller 880 may implement a closed control (e.g., a closed loop feedback control). In some embodiments, the controller 880 may implement both open control (e.g., feed forward control) and closed control (e.g., feedback control).

The controller 880 may receive data or signals from the various devices or components included in the nanoparticles aerosol generator 215, and may send control signals to the various devices or components to adjust control parameters of those devices or components, thereby controlling the process for generating a nanoparticles aerosol with a desired size distribution and/or a desired density. In some embodiments, the controller 880 may be configured to control the temperature gradient within the evaporation chamber 842 (e.g., between the crucible 800 and the exit 825). Although the temperature gradient may not directly affect the movement of the nanoparticles, it may indirectly affect the movement, as lower temperature may reduce the movement, and higher temperature may increase the movement, thereby affecting the density. In some embodiments, the controller 880 may receive data or signals from the thermocouple 877, which may include information relating to the temperature gradient, or which may include temperature information that may be used by the controller 880 to calculate the temperature gradient.

Based on the temperature gradient obtained from the measurements of the thermocouple 877, the controller 880 may control the at least one of the cooling device 860 and the heating device 810 to achieve a desired temperature gradient. The temperature gradient may be adjusted by changing the temperature within the cooling zone 865, the temperature of the crucible 800, or both. To control the cooling device 860, the controller 880 may adjust the amount of cooling fluid, the flow rate of the cooling fluid, and/or the type of the cooling fluid, to control the cooling effect, thereby controlling the temperature within the cooling zone 865. To control the heating device 810, the controller 880 may adjust the amount of electric arc current applied by the heating device 810 or otherwise adjust the total heat supplied to the crucible 800 by the heating device 810.

In some embodiments, the controller 880 may control the heating device 810 to achieve a desired density of the nanoparticles. The source material 805 with a higher temperature may generate more nanoparticles when the source material 805 is blown by the carrier gas flow. Thus, the heating device 810 may be controlled to adjust the temperature of the source material 805 or the crucible 800 based on a desired density. For example, the controller 880 may control the heating device 810 based on information received from the DMA 875 and/or the particle counting device 876.

The controller 880 may receive data or signals from the DMA 875 and/or the particle counting device 876. The data or signals received from the DMA 875 may include information related to the size selection, such as the predetermined size distribution range. The controller 880 may send a control signal to the DMA 875 to set or adjust the size selection. The controller 880 may receive data or signals from the particle counting device 876, which may indicate the density of the nanoparticles. The controller 880 may use size selection information received from the DMA 875 and/or the density information received from the particle counting device 876 in various controls (e.g., a feedback control, a feed forward control, or a combination thereof). Based on the information received from the DMA 875 and/or the density information received from the particle counting device 876, the controller 880 may control other devices or components, such as the dilution gas source 850 and/or the carrier gas source 815, to achieve a desired size selection and/or a desired density.

The controller 880 may communicate with and control the dilution gas source 850 and/or the carrier gas source 815. For example, the controller 880 may receive signals or data from the dilution gas source 850 indicating the amount of dilution gas being supplied to the nanoparticles aerosol flow path, the flow rate of the dilution gas, the type of the dilution gas, etc. The controller 880 may use the information received from the dilution gas source 850 in various controls (e.g., a feedback control, a feed forward control, or a combination thereof) of the process for generating the nanoparticles aerosol. The controller 880 may send control signals to the dilution gas source 850 to adjust, for example, the amount of dilution gas being supplied to the nanoparticles aerosol flow path to dilute the aerosol. The controller 880 may adjust the flow rate of the dilution gas, the type of the dilution gas, etc. The controller 880 may control the dilution gas source 850 based on information received from the DMA 875 and/or the particle counting device 876.

The controller 880 may receive signals or data from the carrier gas source 815 indicating the amount of carrier gas being supplied to blow the source material 805, the flow rate of the carrier gas, the type of the carrier gas, etc. The controller 880 may use the information received from the carrier gas source 815 in various controls of the process for generating the nanoparticles aerosol using the nanoparticles aerosol generator 215. The controller 880 may send control signals to the carrier gas source 815 to adjust, for example, the amount of carrier gas being blown to the source material 805, the flow rate of the carrier gas, the type of the carrier gas, etc. The controller 880 may control the carrier gas source 815 based on information received from the DMA 875 and/or the particle counting device 876. By controlling one or more of the temperature gradient, the dilution gas flow, and the carrier gas flow, the coagulation of nanoparticles in the aerosol may be controlled to achieve a desired size distribution and/or a desired density.

In some embodiments, the controller 880 may control the heating device 810 individually or in combination with the cooling device 860 based on a desired density of the nanoparticles. The source material 805 with a higher temperature may generate more nanoparticles when the source material 805 is blown by the carrier gas flow. Thus, the heating device 810 may be controlled individually to adjust the temperature of the source material 805 or the crucible 800 based on a desired density. For example, the controller 880 may control the heating device 810 based on information received from the DMA 875 that indicates the size selection (or distribution), and/or the particle counting device 876 that indicates the density.

Referring to FIGS. 8-10, the controller 880 may include a memory 882 configured to store computer executable instructions and/or codes, such as computer programs, which may be configured to perform the methods disclosed herein when executed by a processor. The memory 882 may be any suitable tangible memory, such as, for example, a flash memory, a Read-Only Memory (ROM), a Random-Access Memory (RAM), etc. The memory 882 may include at least one hardware component, such as a semiconductor, a circuit, etc.

Referring to FIGS. 8-10, the controller 880 may include a processor 883. The processor 883 may be configured to execute the instructions or codes to perform various methods or processes disclosed herein. The processor 883 may include at least one hardware component, such as, for example, a hardware circuit, a semiconductor, etc. The processor 883, the memory 882, and the communication unit 881 may communicate with one another via buses, wires, and/or other communication means.

Embodiments of the invention also include methods for forming nanowires that allow for large scale production combined with a structural complexity and material quality comparable to nanowires formed using substrate-based synthesis. One method includes providing a first gas to a first inlet conduit to a reaction chamber (or reaction zone), such as a tube furnace. In this method, the first gas may include a first precursor material for fabricating the nanowires. For example, the first gas may include trimethyl gallium (TMG), which may dissociate into gallium and methane at elevated temperatures, thereby providing gallium for gallium based nanowires, such as semiconducting GaAs nanowires. A second gas may be provided to the reaction chamber of the reactor through a second inlet, which may or may not be the same as the first inlet. The second gas may include a second, different precursor gas, such as arsine, which may dissociate into arsenic and hydrogen. In some embodiments, the gallium may form droplets, which may catalyze the dissociation of arsine and the growth of the GaAs nanowire. The sheath gas may be provided through the second inlet. In some embodiments, the catalyst particles may be provided through the first inlet.

Figure 11:
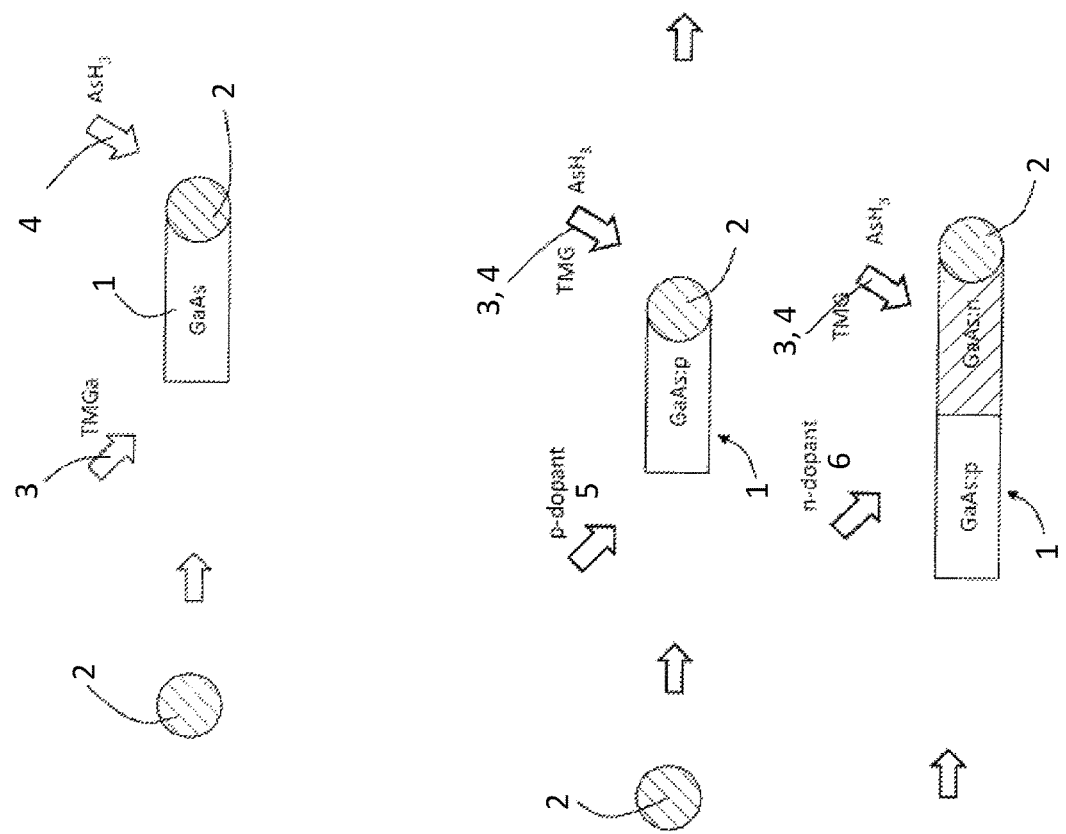
FIG. 11 is a schematic illustration of an exemplary axial growth a nanowire comprising a pn junction.

FIG. 11 is a schematic illustration of an exemplary axial growth a nanowire 1 comprising a pn junction. The method includes providing catalytic nanoparticles 2 suspended in a gas and providing first and second gaseous precursors 3, 4, e.g., TMG and $AsH_3$, which may include constituents of the nanowires 1 to be formed into a reaction chamber (e.g., reaction chamber 210 in reactor 200). The method may include growing single crystal nanowires 1 from the catalytic particles 2 in a gas-phase synthesis, which may include the first and second gaseous precursors 3, 4 while the catalytic nanoparticles are suspended in the gas(es). The first and second precursor gases 3, 4 may be provided to the reactor 200 at room temperature. Alternatively, the first and second precursor gases 3, 4 (as well as the dopant gases, if used) may be pre-heated prior to delivery to the reactor 200.

Nanowire growth may be performed at an elevated temperature in any of the reactors 200, 300, 400 (or systems 500, 1500, 700A, and 700B) as described above. Growth is initiated by catalytic decomposition of the gaseous precursors 3, 4 on the surface of the catalytic nanoparticles 2 and nucleation of the nanowire on the surface of the catalytic nanoparticles 2. After nucleation, the nanowire 1 grows directionally and forms an elongated object, e.g., a nanowire 1. Growth may occur via vapor-liquid-solid (VLS) or chemical vapor deposition (CVD). In some embodiments, the gas flows through the reactor 200 and thereby carries at least the catalytic nanoparticles 2 and thus the nanowires 1 formed on the catalytic nanoparticles 2 through the reactor 200.

The methods as described herein are described in terms of semiconductor materials, in particular III/V-materials. The methods are not limited to this. By way of example, FIG. 11 schematically illustrates the formation of a GaAs wire 1 from a catalytic particle 2, such as gold, and first and second gaseous precursors TMG 3 and $AsH_3$ 4. As shown, the catalytic particles 2 (e.g., nanoparticles 2) may be carried forward by a feed gas into the reactor 200 where the gaseous precursors 3, 4 are present and the reaction takes place. Alternatively, the precursor gases 3, 4 may be added to the gas flow prior to entering the reactor 200 or directly to the reactor 200. For example, as discussed above, the catalytic nanoparticles may be aerosolized in one of the precursor gases 3, 4 by the aerosol nanoparticles generator 215 and provided to the reactor 200 via the inner inlet conduit 206B in the reactor 200, the inner inlet conduit 306C, or the middle input conduit 306B in the reactor 300.

FIG. 11 further schematically illustrates how the disclosed method may be used to form a GaAs nanowire 1 with an axial pn-junction between a p-doped GaAs segment and an n-doped GaAs segment. First and second precursors 3, 4 having group III material and group V material, respectively, and one or more p-dopants, may be provided to the reactor 200. After nucleation, a p-doped GaAs nanowire 1 may be axially grown from the catalytic nanoparticle 2, thereby forming a first axial segment of the GaAs nanowire. Thereafter, the growth conditions may be changed by exchanging the p-dopant with an n-dopant, while substantially maintaining other parameters related to the growth conditions, such that a second axial wire segment may be axially grown on the previously formed first segment in a longitudinal direction. Thus, by varying the growth conditions during axial growth, axial segments with different properties may be obtained.

Figure 12:
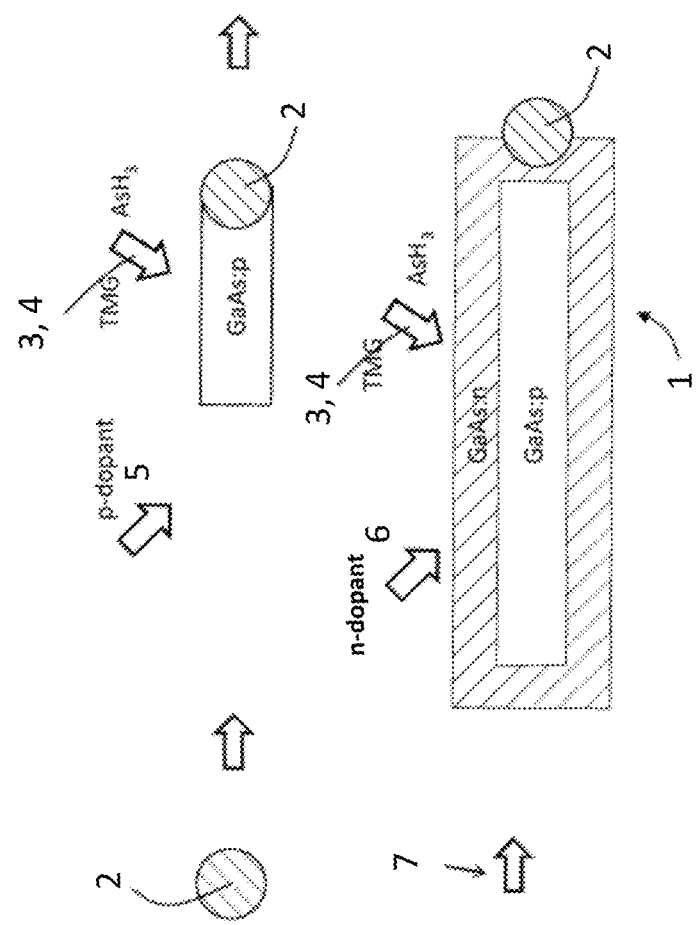
FIG. 12 is a schematic illustration of an exemplary radial/core-shell growth a nanowire comprising a pn junction.

FIG. 12 schematically illustrates the formation of a GaAs nanowire having a radial pn-junction between a p-doped GaAs core and an n-doped GaAs shell. First and second precursors 3, 4, which may include group III material and group V material, respectively, and p-dopants may be provided to the reactor 200 (or reactor 300 or 400, or reactors included in the systems 500, 1500, 700A, and 700B). After nucleation, p-doped GaAs may be axially grown from the catalytic nanoparticle 2, thereby forming the core of the GaAs nanowire 1. Thereafter, the growth conditions may be changed by increasing the temperature and/or the V/III-ratio to promote radial growth and by exchanging the p-dopant to an n-dopant. The shell may be radially grown on the previously formed core in a radial direction thereof. This illustrates the possibility to vary the growth conditions to switch between axial growth and radial growth. Alternatively or additionally, the nanowire may be grown with an n-doped core and a p-doped shell.

Figure 13:
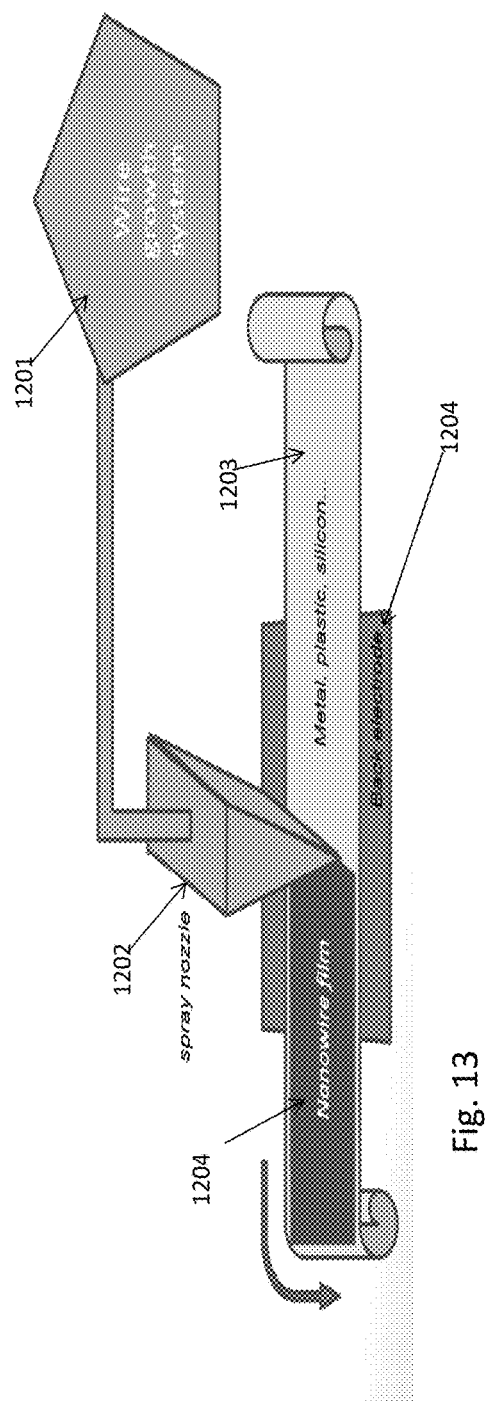
FIG. 13 is a schematic illustration of an exemplary method of depositing nanowires on a substrate.
Figure 14:
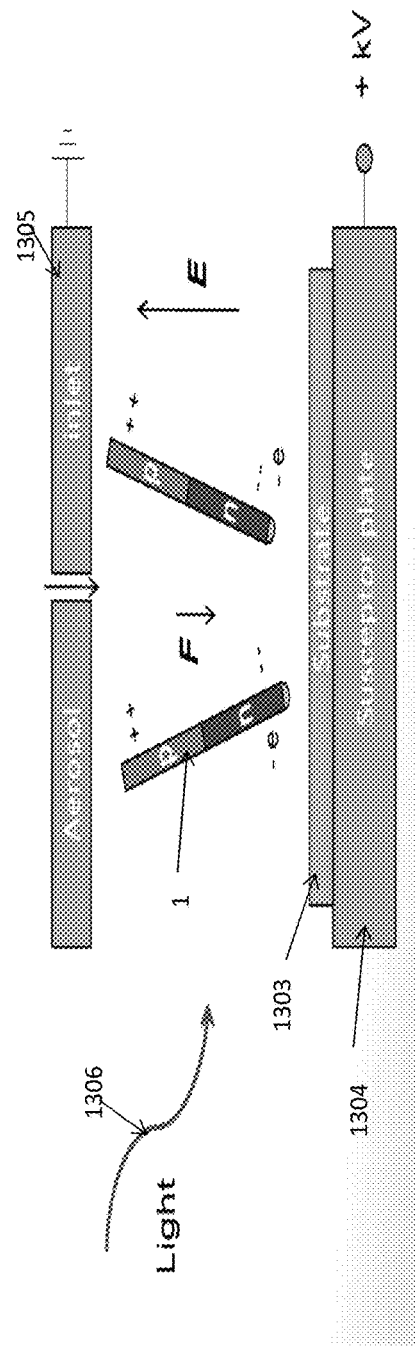
FIG. 14 is a schematic illustration an exemplary method of orienting nanowires on a substrate.

In any of the above methods of fabricating nanowires, the nanowires may be collected upon the completion of growth and then deposited as a film on a substrate and/or oriented in an orientation on a substrate (e.g., with the nanowire axis substantially normal to the substrate surface supporting the nanowires). FIG. 13 illustrates an exemplary method of depositing nanowires on a substrate. FIG. 14 illustrates an exemplary method of depositing and orienting nanowires on a substrate.

In the method illustrated in FIG. 13, nanowires are collected from the growth reactors 200, 300, or 400 (or systems 500, 1500, 700A, and 700B) into a storage reservoir 1201 and then provided from the reservoir 1201 to a spray nozzle 1202. In some embodiments, the nanowires may be provided directly from the reactors 200, 300, or 400, or the systems 500, 1500, 700A, and 700B (e.g., via exhaust 442, which may be included in 200, 300, 400, 500, 1500, 700A, and 700B) to the spray nozzle 1202 without being stored in the reservoir 1201. The spray nozzle 1202 may be configured to spray the nanowires onto a substrate 1203, such as sheet of metal, e.g stainless steel, plastic, silicon, or any other suitable material to form a nanowire film 1204, such as percolating network of nanowires, on the substrate.

As shown in FIG. 14, nanowires 1 are aligned with their long axis perpendicular to the substrate 1303 using an electric dipole generated in the nanowires by an electric field in the deposition chamber 1300. For example, an electric field, E, may be generated in the deposition chamber by a potential difference (i.e., voltage) applied between a susceptor 1304 supporting the substrate and a top plate 1305 above the substrate having an aerosol inlet. The nanowires may be provided from the reservoir or directly from the reactor shown in the preceeding figures as an aerosol into the deposition chamber 1300.

The electric dipole in the nanowires may, by way of example, be generated by one or a combination of the following methods. In a first method, an electric field may be generated to induce an electric polarization in any conducting, semiconducting, or insulating nanowire, and the nanowires may orient themselves along the electric field. For unipolar nanowires, the nanowire may be oriented along the electrical field, with or without a preferred direction for a seed particle end. A unipolarly doped nanowire with an axial gradient in the doping may be oriented, as the more highly p(n)-doped end may be charged positively (negatively), directing this end up (down) in the electric field.

In a second method, a nanowire including a p-doped end and an n-doped end forming a pn-junction in-between may be polarizable more easily than a unipolar nanowire, as shown in FIG. 14. The p-doped end may become positively charged and the n-doped end may be negatively charged when exposed to the electrical field, and hence the nanowire may be oriented in an unequivocal direction with the p-doped end pointing in the direction of the electric field (e.g., up in FIG. 14). The same effect may apply to a unipolarly doped nanowire where a Schottky diode is formed between the wire and its seed particle.

In a third method, illumination of a nanowire containing a pn-junction with light or UV or IR radiation 1306 may induce a strong electric dipole with the same polarity as the electric dipole formed by the electric field, greatly enhancing the effect of the pn-junction itself, as shown in FIG. 14. By illumination with light in different pre-determined wavelength regions, nanowires having different band gaps may be selectively aligned since wires that do not absorb the light may have a much weaker dipole.

Although exemplified with GaAs, other III/V semiconductor materials as well as semiconductor materials comprising group II and group VI materials may be processed in the same way. For example the gaseous precursors of the above examples can be exchanged for trimethyl indium (TMIn) and phosphine ($PH_3$) to form InP wires. Nanowire materials that may be made by the systems and methods disclosed herein include, but are not limited to, GaAs, InP, Ga, $Ga_xIn_{1-x}As_yP_{1-y}$, $Al_xGa_{1-x}As_yP_{1-y}$, GaSb, $Ga_xIn_{1-x}As_ySb_{1-y}$, GaN, InN, AlN, $Al_xGa_xIn_{1-x-y}N$, InGaN, Si, SiC, Ge or $Si_xGe_{1-x}$, where $0 \leq x \leq 1$, $0 \leq y \leq 1$ and $0 \leq z \leq 1$ and $x+y+z=1$. The reactor configuration does not have to be changed to form wires from different gaseous precursors; instead, the gaseous precursors may be switched, e.g. in the systems 500, 700A, 700B. Moreover, the processes such as those exemplified by FIGS. 9 and 10 may be performed with or without the addition of dopants. Insulators may also be grown. Single or multiple reactors or reaction chambers within a reactor may be used to improve the formation of segments, cores or shells having different composition, doping or conductivity type. Moreover, axial and radial growth may not necessarily be fully decoupled, process conditions may be selected such that the nanowires grow both radially and axially at the same time. By choosing appropriate gaseous precursor, flows, temperatures, pressures, and particle sizes, the nanowire material can be made to grow in the axial or radial direction, or in a combination of the two growth directions.

Sheath gases may include, but are not limited to, nitrogen, hydrogen and noble gases such as helium and argon. Precursor gases may include, but are not limited to, TMG, TMIn, TEG, TEIn, TMAl, TEAl, $NH_3$, $AsH_3$ and $PH_3$. Suitable dopants depend on the nanowire material being doped. Examples include, but are not limited to, (1) InGaAl—AsPSb: n-dopants: S, Se, Si, C, Sn; p-dopants: Zn, Si, C, Be; (2) AlInGaN: n-dopants: Si; p-dopants: Mg; (3) Si: n-dopants: P, As, Sb; p-dopants: B, Al, Ga, In; (4) CdZn—OSSeTe system: p-dopants: Li, Na, K, N, P, As; n-dopants: Al, Ga, In, Cl, I.

In some embodiments of the disclosed method, a reactor 200 having an inner inlet 202B located concentrically within the outer inlet 202A may be used to overcome the wall effects of conventional gas methods of nanowire growth. With this configuration, a first gas and a second gas may be provided to the reaction chamber or reaction zone such that second gas forms a sheath separating the first gas from the wall (e.g., wall 201A) of the reaction chamber (e.g., reaction chamber 210). In this manner, the first, inner gas is shielded from the detrimental effects of the temperature gradients and viscous effects caused by the wall 201A. In some embodiments, both the first gas and the second gas may be provided with laminar flows. By means of diffusion, the gas carrying the catalytic particles and/or nanowires may be substantially exchanged for the sheath gas in embodiments where the core and sheath gases are different. This may be advantageous for providing different chemical reactions in sequential reactor sections 200A, 200B, etc.

In some embodiments, catalytic seed nanoparticles 2 may be provided with the first precursor gas 3 and optionally the second precursor gas 4 in the first, inner inlet 202B as a common inner gas stream. The catalyst seed nanoparticles may be aerosolized in the first precursor gas 3 or separately aerosolized in a different gas and added to the first, inner inlet 202B. In some embodiments, the second gas may include a second precursor gas 4. In some embodiments, the second gas may be an inert gas such as nitrogen, argon or helium. In some embodiments, the first gas may include only one precursor gas 3, such as silane, which may dissociate into silicon and hydrogen while the second gas is inert. In some embodiments, single element nanowires, such silicon nanowires, may be grown. In some embodiments, one or more dopant gases (e.g. $PH_3$ or $AsH_3$ for n-type doping and $B_2H_2$ for p-type doping) may be included in the first gas. In this manner, a doped, "single element" nanowire may be produced.

Figure 15:
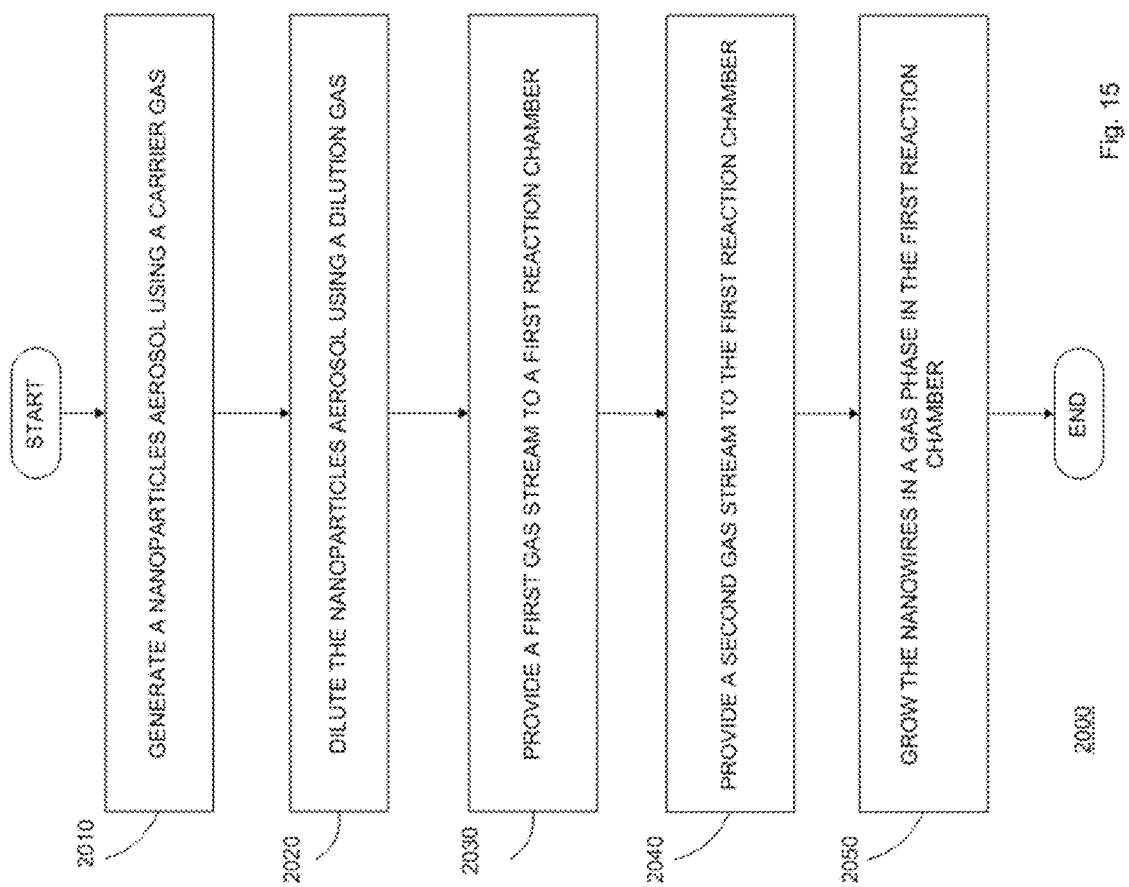
FIG. 15 is a flowchart showing an exemplary method of fabricating nanowires.

FIG. 15 is a flowchart showing an exemplary method 2000 of fabricating nanowires. The method 2000 may include generating a nanoparticles aerosol using a carrier gas that is blown toward a source material disposed within an evaporation chamber, the nanoparticles aerosol including nanoparticles of the source material (step 2010). The method 2000 may include diluting the nanoparticles aerosol using a dilution gas, the dilution gas flowing substantially along an inner surface of a first wall of the evaporation chamber (step 2020). The method 2000 may include providing a first gas stream to a first reaction chamber, wherein the first gas stream comprises a first precursor for fabricating the nanowires and the nanoparticles (step 2030). The method 2000 may include providing a second gas stream to the first reaction chamber, wherein the second gas stream forms a sheath separating the first gas stream from a second wall of the first reaction chamber (step 2040). The method 2000 may include growing the nanowires in a gas phase in the first reaction chamber (step 2050).

FIG. 16 is a flowchart showing an exemplary method 3000 of generating a nanoparticles aerosol. The method 3000 may include heating a source material (step 3010). The method 3000 may include blowing a carrier gas toward the source material to generate the nanoparticles aerosol that flows within a chamber having a wall (step 3020). The method 3000 may include supplying a dilution gas into the chamber to dilute the nanoparticles aerosol, the dilution gas flowing substantially along an inner surface of the wall (step 3030).

Although the foregoing refers to particular embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety. It is further understood that the examples shown in different figures are not mutually exclusive. Features or elements shown in one example (e.g., one figure) may also be included in another example (e.g., another figure). For example, different configurations for the reactors and/or systems may be combined in some applications. Any one or more features of any example may be used in any combination with any one or more other features of one or more other examples. It is intended that the specification and examples be considered as exemplary only, with a true scope being indicated by the following claims and their equivalents.

What is claimed is:

1. A nanowire growth system, comprising:
   a reaction chamber including a first, solid wall;
   a first inlet configured to deliver a first flow into the reaction chamber; and
   a second inlet configured to deliver a second flow into the reaction chamber,
   wherein the first inlet is located concentrically with the second inlet and the first and second inlets are configured such that the second flow delivered from the second inlet provides a sheath between the first flow delivered from the first inlet and an entirety of the first, solid wall of the reaction chamber, wherein the second flow is in contact with the first flow along the entirety of the reaction chamber,
   wherein the nanowire growth system further comprises a nanoparticles aerosol generator including:
      an evaporation chamber having a second, solid wall, the evaporation chamber disposed upstream of least one of the first inlet and the second inlet;
      a crucible container located within the evaporation chamber containing a source material;
      a thermal, electric arc or induction heating device configured to heat and evaporate the source material by thermal heating, electric arc heating, induction heating;
      a carrier gas source configured to blow a carrier gas toward the source material within the evaporation chamber to generate a nanoparticles aerosol with nanoparticles of the source material suspended therein; and
      a dilution gas source configured to supply a dilution gas into the evaporation chamber to flow substantially along the second, solid wall within the evaporation chamber and to dilute the nanoparticles aerosol.

2. The nanowire growth system of claim 1, wherein the second inlet further comprises a porous frit.

3. The nanowire growth system of claim 1, further comprising a first outlet and a second outlet located at an opposite wall of the reaction chamber from the first and second inlets and wherein the first outlet is located concentrically with the second outlet.

4. The nanowire growth system of claim 3, further comprising one or more heaters configured to heat the first inlet and the second inlet.

5. The nanowire growth system to claim 1, further comprising one or more heaters configured to heat the reaction chamber.

6. The nanowire growth system of claim 1, wherein the first and second inlets and the first and second outlets comprise respective inlet and outlet conduits connected to the respective inlets and outlets.

7. The nanowire growth system of claim 1, wherein the nanoparticles aerosol generator further comprises:
   a cooling device disposed outside of the second, solid wall and configured to reduce temperature within a cooling zone in the evaporation chamber.

8. The nanowire growth system of claim 1, wherein the nanoparticles aerosol generator further comprises:
   a differential mobility analyzer disposed adjacent an exit of the evaporation chamber, and configured to perform a size selection of the nanoparticles.

9. The nanowire growth system of claim 8, wherein the nanoparticles aerosol generator further comprises:
   a particle counting device disposed downstream of the differential mobility analyzer and configured to measure the density of the nanoparticles.

10. The nanowire growth system of claim 9, wherein the nanoparticles aerosol generator further comprises:
    a controller configured to control coagulation of the nanoparticles by controlling the dilution gas source to introduce the dilution gas source into the evaporation chamber adjacent to the crucible above a top surface of the source material, such that the nanoparticles are immediately diluted after formation and the nanoparticles aerosol is diluted to reduce coagulation and particle size distribution due to decreased coagulation rate for the nanoparticles suspended in the diluted nanoparticles aerosol.

11. The nanowire growth system of claim 10, wherein the controller is further configured to flow the dilution gas substantially along the second, solid wall within the evaporation chamber to form a dilution gas flow shield that separates the second, solid wall from the nanoparticles aerosol formed by the carrier gas flow and the nanoparticles, thereby preventing the nanoparticles from depositing on the second, solid wall.

12. The nanowire growth system of claim 9, wherein the nanoparticles aerosol generator further comprises:
a controller configured to control at least one the heating device, the carrier gas source, and the dilution gas source based on information receive from at least one of the differential mobility analyzer and the particle counting device.

13. The nanowire growth system of claim 1, wherein the nanoparticles aerosol generator further comprises:
a thermocouple configured to measure a temperature gradient within the evaporation chamber.

14. The nanowire growth system of claim 1, wherein the nanoparticles aerosol generator further comprises:
a controller configured to control a density of the nanoparticles aerosol by controlling at least one of a temperature within the evaporation chamber, the carrier gas source, and the dilution gas source.

15. The nanowire growth system of claim 1, wherein the nanoparticles aerosol generator further comprises a dilution gas inlet conduit located outside the second, solid wall.

16. The nanowire growth system of claim 1, wherein the nanoparticles aerosol generator further comprises a dilution gas inlet conduit located in a space between the second wall and the container.

17. The nanowire growth system of claim 1, wherein the nanoparticles aerosol generator further comprises a dilution gas inlet conduit located at least partially within the container.

18. A nanowire growth system, comprising:
means for generating a nanoparticles aerosol located within an evaporation chamber using a carrier gas that is blown toward a source material disposed within the evaporation chamber, the nanoparticles aerosol including nanoparticles of the source material;
means for diluting the nanoparticles aerosol using a dilution gas, the dilution gas provided into the evaporation chamber adjacent to and above a top surface of the source material, such that the nanoparticles are immediately diluted after formation and the nanoparticles aerosol is diluted to reduce coagulation and particle size distribution due to decreased coagulation rate for the nanoparticles suspended in the diluted nanoparticles aerosol, and then the dilution gas flowing substantially along an inner surface of a first, solid wall of the evaporation chamber;
means for providing a first gas stream to a reaction chamber, wherein the first gas stream comprises the nanoparticles and a first precursor for fabricating the nanowires;
means for providing a second gas stream to the reaction chamber, wherein the second gas stream forms a sheath separating the first gas stream from an entirety of a second, solid wall of the reaction chamber, wherein the second gas stream is in contact with the first gas stream along the entirety of the reaction chamber; and
means for growing the nanowires in a gas phase in the reaction chamber.

19. The nanowire growth system of claim 18, further comprising means for providing nanowire growth catalyst particles to the reaction chamber.

20. The nanowire growth system of claim 18, further comprising means for heating the reaction chamber, wherein the dilution gas flowing substantially along the inner surface of the first, solid wall of the evaporation chamber forms a dilution gas flow shield that separates the first, solid wall from the nanoparticles aerosol formed by the carrier gas flow and the nanoparticles, thereby preventing the nanoparticles from depositing on the first, solid wall.

* * * * *